US008080871B2

(12) United States Patent
Dangelo et al.

(10) Patent No.: US 8,080,871 B2
(45) Date of Patent: Dec. 20, 2011

(54) CARBON NANOTUBE-BASED STRUCTURES AND METHODS FOR REMOVING HEAT FROM SOLID-STATE DEVICES

(75) Inventors: Carlos Dangelo, Los Gatos, CA (US); Ephraim Suhir, Los Altos, CA (US); Subrata Dey, Fremont, CA (US); Barbara Wacker, Saratoga, CA (US); Yuan Xu, Milpitas, CA (US); Arthur Boren, San Jose, CA (US); Darin Olsen, Menlo Park, CA (US); Yi Zhang, Sunnyvale, CA (US); Peter Schwartz, Livermore, CA (US); Bala Padmakumar, Mountain View, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 533 days.

(21) Appl. No.: 12/177,815

(22) Filed: Jul. 22, 2008
(Under 37 CFR 1.47)

(65) Prior Publication Data
US 2011/0103020 A1    May 5, 2011

Related U.S. Application Data

(63) Continuation of application No. 11/749,116, filed on May 15, 2007, now abandoned, which is a continuation-in-part of application No. 11/498,408, filed on Aug. 2, 2006, which is a continuation of application No. 10/925,824, filed on Aug. 24, 2004, now Pat. No. 7,109,581.

(60) Provisional application No. 60/497,849, filed on Aug. 25, 2003.

(51) Int. Cl.
*H01L 23/34* (2006.01)

(52) U.S. Cl. ......... 257/720; 257/E23.101; 257/E23.105; 257/706; 257/778; 438/108; 438/122; 438/125; 977/742; 977/762

(58) Field of Classification Search ........... 257/E23.101, 257/E23.105, 760, 720, 778; 438/108, 122, 438/125; 977/742, 762
See application file for complete search history.

(56) References Cited

U.S. PATENT DOCUMENTS 6,110,264 A    8/2000  Banning et al. ............ 106/31.29
(Continued)

FOREIGN PATENT DOCUMENTS

WO    WO2005/041256    5/2005

OTHER PUBLICATIONS

Antunes et al., *Carbon* 44:2002-2211 (2006).
(Continued)

*Primary Examiner* — Asok Sarkar
(74) *Attorney, Agent, or Firm* — Harness, Dickey & Pierce, P.L.C.

(57) ABSTRACT

One aspect of the invention includes a copper substrate; a catalyst on top of the copper substrate surface; and a thermal interface material that comprises a layer containing carbon nanotubes that contacts the catalyst. The carbon nanotubes are oriented substantially perpendicular to the surface of the copper substrate. A Raman spectrum of the layer containing carbon nanotubes has a D peak at ~1350 cm$^{-1}$ with an intensity ID, a G peak at ~1585 cm$^{-1}$ with an intensity IG, and an intensity ratio $I_D/I_G$ of less than 0.7 at a laser excitation wavelength of 514 nm. The thermal interface material has: a bulk thermal resistance, a contact resistance at an interface between the thermal interface material and the copper substrate, and a contact resistance at an interface between the thermal interface material and a solid-state device. A summation of these resistances has a value of 0.06 cm$^2$K/W or less.

22 Claims, 26 Drawing Sheets

U.S. PATENT DOCUMENTS

| | | | |
|---|---|---|---|
| 7,168,484 B2 * | 1/2007 | Zhang et al. | 165/185 |
| 2003/0117770 A1 | 6/2003 | Montgomery et al. | 361/687 |
| 2005/0037204 A1 | 2/2005 | Osiander et al. | 428/408 |

OTHER PUBLICATIONS

Gan et al., *Diamond and Related Materials* 9:897-900 (Apr. 2000).

Ngo et al., *Nano Letters* 4(12):2403-2407 (2004).

Sun, "Study of Interactions at the Atomic Scale," PhD Thesis, McGill University, Montréal, Québec, Canada, pp. 1-117 (2004).

Teo et al., *Applied Physics Letters* 80(11):2011-2013 (Mar. 18, 2002).

Xu et al., *International Journal of Heat and Mass Transfer*, pp. 1658-1666 (2006).

* cited by examiner

Bond a back surface of a copper substrate to a recessed cavity in a heat spreader, wherein a thermal interface material is attached to a front surface of the copper substrate, wherein the thermal interface material comprises a layer of carbon nanotubes oriented substantially perpendicular to the front surface of the copper substrate — 1202

Figure 12A

Place a phase change material between carbon nanotubes in a layer containing carbon nanotubes, wherein a Raman spectrum of the layer containing carbon nanotubes has an intensity ratio $I_D / I_G$ of less than 0.7 — 1302

Figure 13A

Contact a solid-state device with a thermal interface material, wherein: the thermal interface material is attached to a copper substrate with a front surface and a back surface; the thermal interface material comprises a layer of carbon nanotubes that are oriented substantially perpendicular to the front surface of the copper substrate; and the back surface of the copper substrate is bonded to a recessed cavity in a heat spreader ⟵ 1702

Figure 17

CARBON NANOTUBE-BASED STRUCTURES AND METHODS FOR REMOVING HEAT FROM SOLID-STATE DEVICES

RELATED APPLICATIONS

This application claims the benefit of: (A) U.S. Provisional Application No. 60/800,935, filed May 16, 2006, entitled "Small-size coupons and bonded assemblies for CNT-based thermal management of IC devices"; (B) U.S. Provisional Application No. 60/862,664, filed Oct. 24, 2006, entitled "Method and apparatus for the evaluation and improvement of mechanical and thermal properties of CNT/CNF arrays"; and (C) U.S. Provisional Application No. 60/874,579, filed Dec. 12, 2006, entitled "Carbon nanotube-based structures and methods for removing heat from solid-state devices". All of these applications are incorporated by reference herein in their entirety.

This application is a continuation of U.S. patent application Ser. No. 11/749,116, filed May 15, 2007 now abandoned, which is a continuation-in-part of: (A) U.S. patent application Ser. No. 11/498,408, filed Aug. 2, 2006, which is a continuation of application Ser. No. 10/925,824, now U.S. Pat. No. 7,109,581, filed Aug. 24, 2004, which in turn claims the benefit of U.S. Provisional Application No. 60/497,849 filed Aug. 25, 2003; and (B) U.S. patent application Ser. No. 11/386,254, filed Mar. 21, 2006, entitled "Apparatus for attaching a cooling structure to an integrated circuit," which in turn claims the benefit of U.S. Provisional Application No. 60/663,225, filed Mar. 21, 2005. All of these applications are incorporated by reference herein in their entirety.

TECHNICAL FIELD

The disclosed embodiments relate generally to structures and methods for removing heat from integrated circuits and other solid-state devices. More particularly, the disclosed embodiments relate to structures and methods that use carbon nanotubes to remove heat from integrated circuits and other solid-state devices.

BACKGROUND

As the speed and density of modern integrated circuits (ICs) increase, the power generated by these chips also increases. The ability to dissipate the heat being generated by IC dies is becoming a serious limitation to advances in IC performance. Similar heat dissipation problems arise in other solid-state devices, such as light emitting diodes (LEDs), lasers, power transistors, RF devices, and solar cells.

Considerable effort has been put into developing materials and structures for use as thermal interface materials, heat spreaders, heat sinks, and other packaging components for ICs and solid-state devices, with limited success.

Thus, there remains a need to develop new structures and methods for removing heat from ICs and other solid-state devices that are compatible with current semiconductor packaging technology, provide low thermal resistances, and are low cost.

SUMMARY

The present invention addresses the problems described above by providing carbon nanotube-based structures and methods for removing heat from IC dies and other solid-state devices.

One aspect of the invention involves an article of manufacture that includes a copper substrate with a surface. The copper substrate has a shape that is configured to fit in a recessed cavity in a heat spreader. The article of manufacture also includes a catalyst on top of the copper substrate surface and a layer containing carbon nanotubes that contacts the catalyst. The carbon nanotubes are oriented substantially perpendicular to the surface of the copper substrate.

Another aspect of the invention involves an article of manufacture that includes: a copper substrate with a surface; a catalyst on top of the copper substrate surface; and a layer containing carbon nanotubes that contacts the catalyst. The carbon nanotubes are oriented substantially perpendicular to the surface of the copper substrate. A Raman spectrum of the layer containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm.

Another aspect of the invention involves a method that includes cleaning an oxygen-free copper substrate. The copper substrate has a shape that is configured to fit in a recessed cavity in a heat spreader. The method also involves forming a catalyst on top of the copper substrate and growing a layer containing carbon nanotubes on the catalyst.

Another aspect of the invention involves a method that includes: cleaning an oxygen-free copper substrate; forming a catalyst on top of the copper substrate; and growing a layer containing carbon nanotubes on the catalyst. A Raman spectrum of the layer containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm.

Another aspect of the invention involves an article of manufacture that includes a heat spreader with a recessed cavity. The recessed cavity is configured to incorporate a substrate with a thermal interface material.

Another aspect of the invention involves a method that includes forming a recessed cavity in a heat spreader. The recessed cavity is configured to incorporate a substrate with an attached thermal interface material.

Another aspect of the invention involves an article of manufacture that includes: a heat spreader with a surface configured to face a solid state-device, and a thermal interface material attached to the heat spreader. The thermal interface material comprises a layer of carbon nanotubes. The carbon nanotubes are oriented substantially perpendicular to the surface of the heat spreader configured to face a solid state-device. A Raman spectrum of the layer of carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm.

Another aspect of the invention involves a method that includes cleaning a surface of a heat spreader. The heat spreader comprises copper with less than 40 parts per million (ppm) oxygen. The method also includes: forming a catalyst on top of the surface of the heat spreader, and growing a layer containing carbon nanotubes on the catalyst. A Raman spectrum of the layer containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm.

Another aspect of the invention involves an article of manufacture that includes: a heat spreader with a recessed cavity; a copper substrate with a front surface and a back surface; and a thermal interface material attached to the front surface of the copper substrate. The back surface of the copper substrate is bonded to the recessed cavity. The thermal interface material comprises a layer of carbon nanotubes. The carbon nanotubes are oriented substantially perpendicular to the front surface of the copper substrate.

Another aspect of the invention involves a method that includes growing a layer containing carbon nanotubes on top of a front surface of a copper substrate. The layer of carbon nanotubes are oriented substantially perpendicular to the front surface of the copper substrate. The method also includes bonding a back surface of the copper substrate to a recessed cavity in a heat spreader.

Another aspect of the invention involves a method that includes bonding a back surface of a copper substrate to a recessed cavity in a heat spreader. A thermal interface material is attached to a front surface of the copper substrate. The thermal interface material comprises a layer of carbon nanotubes oriented substantially perpendicular to the front surface of the copper substrate.

Another aspect of the invention involves a method that includes placing a phase change material between carbon nanotubes in a layer containing carbon nanotubes. A Raman spectrum of the layer containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm.

Another aspect of the invention involves an article of manufacture that includes: a solid state-device; a heat spreader with a surface facing the solid state-device; and a thermal interface material attached to the heat spreader and contacting the solid state-device. The thermal interface material comprises a layer of carbon nanotubes. The carbon nanotubes are oriented substantially perpendicular to the surface of the heat spreader facing the solid-state device. A Raman spectrum of the layer of carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm.

Another aspect of the invention involves a method that includes contacting a solid state-device with a thermal interface material. The thermal interface material is attached to a surface of a heat spreader. The thermal interface material comprises a layer of carbon nanotubes that are oriented substantially perpendicular to the surface of the heat spreader. A Raman spectrum of the layer of carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm.

Another aspect of the invention involves an article of manufacture that includes: a solid state-device; a heat spreader with a recessed cavity; a copper substrate with a front surface and a back surface; and a thermal interface material attached to the front surface of the copper substrate. The back surface of the copper substrate is bonded to the recessed cavity. The thermal interface material contacts the solid-state device. The thermal interface material comprises a layer of carbon nanotubes. The carbon nanotubes are oriented substantially perpendicular to the front surface of the copper substrate.

Another aspect of the invention involves a method that includes contacting a solid state-device with a thermal interface material. The thermal interface material is attached to a copper substrate with a front surface and a back surface. The thermal interface material comprises a layer of carbon nanotubes that are oriented substantially perpendicular to the front surface of the copper substrate. The back surface of the copper substrate is bonded to a recessed cavity in a heat spreader.

Another aspect of the invention involves a method that includes: generating heat in a solid state-device; and conducting at least some of the heat away from the solid-state device via a thermal interface material and a heat spreader with a surface facing the solid-state device. The thermal interface material comprises a layer of carbon nanotubes oriented substantially perpendicular to the surface of the heat spreader facing the solid-state device. A Raman spectrum of the layer of carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm.

Another aspect of the invention involves a method that includes: generating heat in a solid state-device; and conducting at least some of the heat away from the solid-state device via a thermal interface material attached to a copper substrate. The copper substrate is bonded to a recessed cavity in a heat spreader.

Another aspect of the invention involves a method that includes obtaining a Raman spectrum from an article of manufacture that comprises a thermal interface material with a layer of carbon nanotubes. The Raman spectrum of the layer of carbon nanotubes has a D peak at ~1350 cm$^{-1}$ with an intensity $I_D$ and a G peak at ~1585 cm$^{-1}$ with an intensity $I_G$. The method also includes accepting the article of manufacture if the Raman spectrum has an intensity ratio $I_D/I_G$ less than a predetermined value and rejecting the article of manufacture if the Raman spectrum has an intensity ratio $I_D/I_G$ greater than the predetermined value.

The thermal interface material comprises the layer containing carbon nanotubes. The thermal interface material has: a bulk thermal resistance, a contact resistance at an interface between the thermal interface material and a copper substrate or a heat spreader, and a contact resistance at an interface between the thermal interface material and the solid-state device. In some embodiments, a summation of these resistances has a value of 0.06 cm$^2$K/W or less. In some embodiments, the summation has a value of 0.03 cm$^2$K/W or less. In some embodiments, the summation has a value of 0.02 cm$^2$K/W or less. In some embodiments, the summation has a value between 0.02-0.06 cm$^2$K/W.

Thus, the present invention provides carbon nanotube-based structures and methods that more efficiently remove heat from IC dies and other solid-state devices. Such structures and methods are compatible with current semiconductor packaging technology, provide low thermal resistances, and are low cost.

BRIEF DESCRIPTION OF THE DRAWINGS

For a better understanding of the aforementioned aspects of the invention as well as additional aspects and embodiments thereof, reference should be made to the Description of Embodiments below, in conjunction with the following drawings in which like reference numerals refer to corresponding parts throughout the figures. For clarity, features in some figures are not drawn to scale.

FIG. 12A is a flow diagram illustrating a process for bonding a back surface of a copper substrate to a recessed cavity in a heat spreader in accordance with some embodiments.

FIG. 13A is a flow diagram illustrating a process for placing a phase change material between carbon nanotubes in a layer containing carbon nanotubes in accordance with some embodiments.

FIG. 17 is a flow diagram illustrating a process for contacting a solid state-device (e.g., an integrated circuit) with a thermal interface material in accordance with some embodiments.

DESCRIPTION OF EMBODIMENTS

Figure 1:
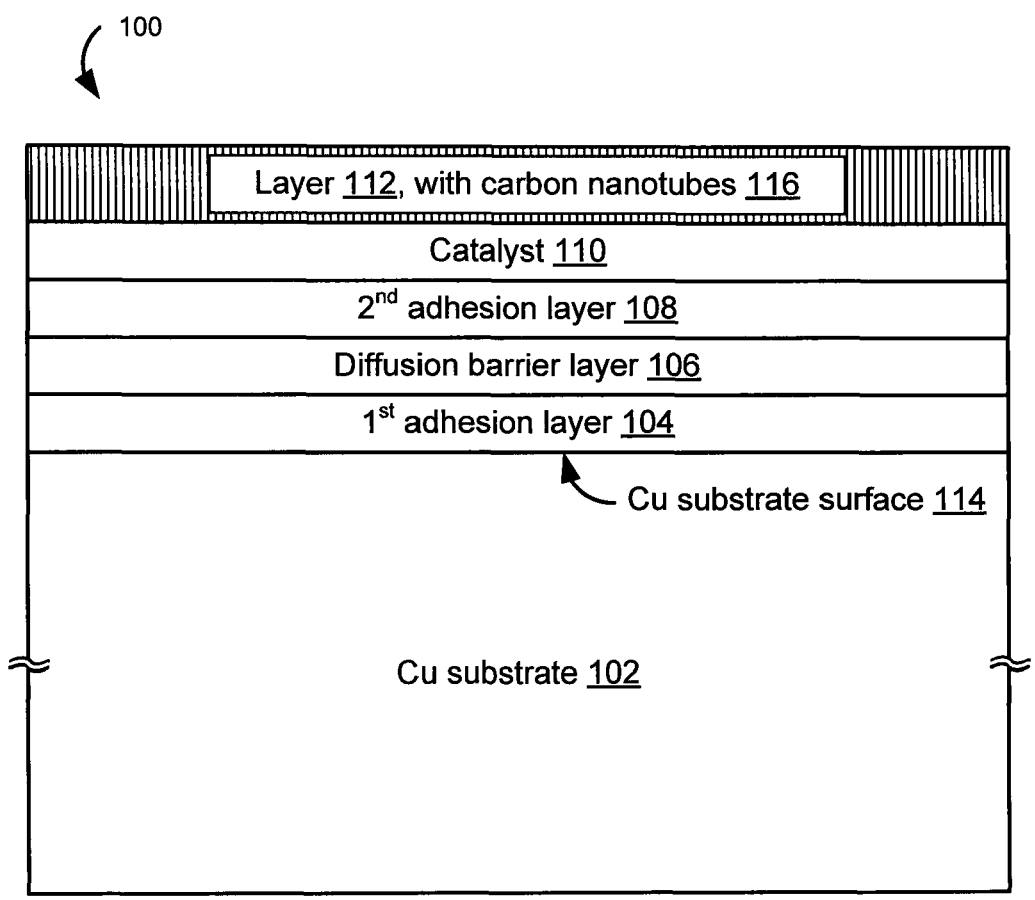
FIG. 1 is a schematic cross section of an article of manufacture in accordance with some embodiments.

Carbon nanotube-based structures and methods for removing heat from ICs and other solid-state devices are described. As used in the specification and claims, "carbon nanotubes" include carbon nanotubes of varying structural quality, from carbon nanotubes with few defects to carbon nanotubes with many defects (the latter of which are sometimes referred to in the art as "carbon nanofibers"). Thus, as used herein, "carbon nanotubes" include "carbon nanofibers." Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention as defined by the appended claims.

Moreover, in the following description, numerous specific details are set forth to provide a thorough understanding of the present invention. However, it will be apparent to one of ordinary skill in the art that the invention may be practiced without these particular details. In other instances, methods, procedures, and components that are well known to those of ordinary skill in the art are not described in detail to avoid obscuring aspects of the present invention.

It will be understood that when a layer is referred to as being "on top of" another layer, it can be directly on the other layer or intervening layers may also be present. In contrast, when a layer is referred to as "contacting" another layer, there are no intervening layers present.

It will also be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer, without departing from the scope of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof The present invention is described below with reference to block diagrams and/or flowchart illustrations of systems, devices, and/or methods according to embodiments of the invention. It should be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

FIG. 1 is a schematic cross section of an article of manufacture 100 in accordance with some embodiments.

The article of manufacture 100 comprises a copper substrate 102 with a surface 114. The copper substrate may be pure copper (e.g., electrical copper with at least 99.99% purity) or a copper alloy. In some embodiments, the copper substrate 102 contains less than 40 parts per million (ppm) oxygen. In some embodiments, the copper substrate 102 contains 10 ppm oxygen or less. In some embodiments, the copper substrate is oxygen-free copper (OFC). We have found that reducing the amount of oxygen in the substrate increases the uniformity of the carbon nanotubes that are subsequently grown on top of the substrate.

Figure 2:
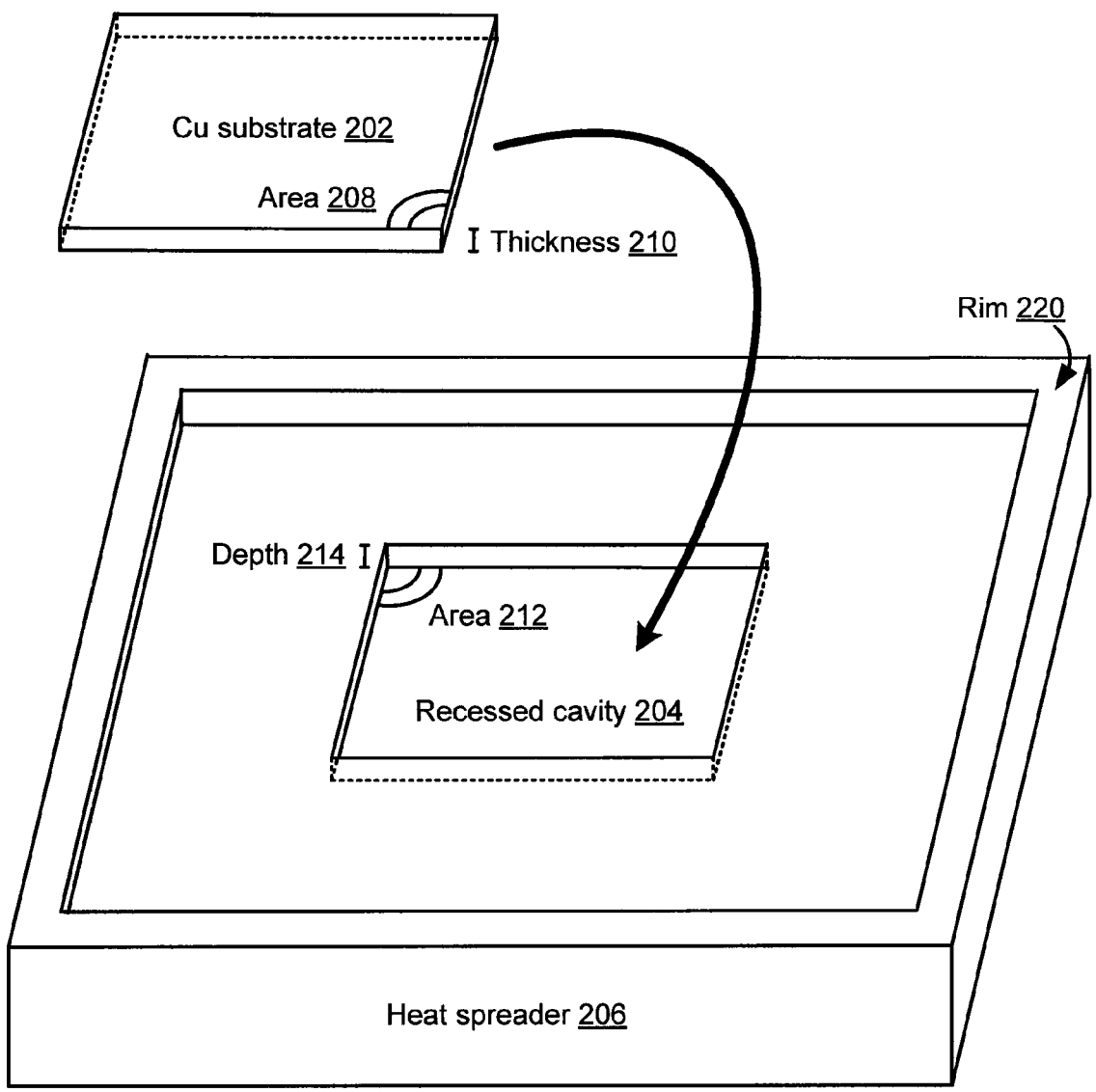
FIG. 2 is a schematic drawing of a copper substrate that is configured to fit in a recessed cavity in a heat spreader in accordance with some embodiments.

FIG. 2 is a schematic drawing of a copper substrate 202 that is configured to fit in a recessed cavity 204 in a heat spreader 206 in accordance with some embodiments.

In some embodiments, the copper substrate 102 (e.g., 202) has a shape that is configured to fit in a recessed cavity 204 in a heat spreader 206. In some embodiments, the copper substrate has a cross-sectional area 208 and thickness 210 that substantially correspond to the cross-sectional area 212 and depth 214 of the recessed cavity 204, respectively. The copper substrate cross-sectional area 208 and thickness 210 may be slightly smaller than the cross-sectional area 212 and depth 214 of the recessed cavity 204, respectively, to allow for bonding material(s) that attach the substrate to the recessed cavity in the heat spreader. Typical areas 208 range from 49 $mm^2$ (e.g., 7 mm×7 mm) to 2500 $mm^2$ (e.g., 50 mm×50 mm). Typical thicknesses 210 range from 0.1 mm to 2.0 mm, with 0.5 mm to 1.0 mm being preferred. In some embodiments, the heat spreader 206 is made of copper, a copper alloy, nickel-plated copper, or another high thermal conductivity substrate with a melting point above 900° C. (e.g., CuW, SiC, AlN, or graphite). In some embodiments, the heat spreader 206 does not have a rim 220.

In some embodiments, the copper substrate 102 (e.g., 202) has a cross-sectional area 208 that substantially corresponds to the cross-sectional area of an integrated circuit or other solid-state device. Thus, the area of thermal interface material formed on the copper substrate can be tailored to the corresponding area of an integrated circuit or other solid-state device that will contact the thermal interface material.

In some embodiments, the article of manufacture 100 includes a first adhesion layer 104 that contacts the surface 114 of the copper substrate 102. The first adhesion layer helps keep subsequent layers firmly attached to the copper substrate. In some embodiments, the first adhesion layer 104 has a thickness between 200 and 5000 Å and comprises Ti, TiN, Cr, or Ta. In some embodiments, the first adhesion layer 104 has a thickness between 200 and 500 Å and comprises Ti.

In some embodiments, the article of manufacture 100 includes a diffusion barrier layer 106 on top of the first adhesion layer 104. The diffusion barrier layer minimizes diffusion of a catalyst 110 into the copper substrate during subsequent high-temperature processing (e.g., during nanotube growth). In some embodiments, the diffusion barrier layer 106 has a thickness between 100 and 400 Å and comprises TiN, $SiO_2$, $Al_2O_3$, or TaN. In some embodiments, the diffusion barrier layer 106 has a thickness between 100 and 400 Å and comprises TiN.

In some embodiments, the article of manufacture 100 includes a second adhesion layer 108 between the diffusion barrier layer 106 and the catalyst 110. Although not required, the second adhesion layer promotes adhesion of the catalyst 110 during subsequent high-temperature processing (e.g., during nanotube growth), when thermal stresses create nucleation sites in the catalyst 110. In some embodiments, the second adhesion layer 108 has a thickness between 25 and 400 Å and comprises Ti, $SiO_2$, TiN, $Al_2O_3$, or Mo. In some embodiments, the second adhesion layer 108 has a thickness between 25 and 200 Å and comprises Ti.

The article of manufacture 100 includes a catalyst 110 on top of the copper substrate surface 114. As the name implies, the catalyst catalyzes growth of the carbon nanotubes. The catalyst is deposited as a layer. The catalyst layer may subsequently form catalyst particles that act as carbon nanotube nucleation sites during the process used to form carbon nanotubes. In some embodiments, the as-deposited catalyst 110 has a thickness between 30 and 1000 Å and comprises Ni, Fe, or Co. In some embodiments, the as-deposited catalyst 110 has a thickness between 200 and 400 Å and comprises Ni.

The article of manufacture 100 also includes a layer 112 containing carbon nanotubes 116 that contacts the catalyst 110. The carbon nanotubes 116 are oriented substantially perpendicular to the surface 114 of the copper substrate. This orientation minimizes the thermal resistance of the layer 112 and of thermal interface materials that include the layer 112. In some embodiments, the carbon nanotubes 116 comprise multiwalled carbon nanotubes.

Figure 3:
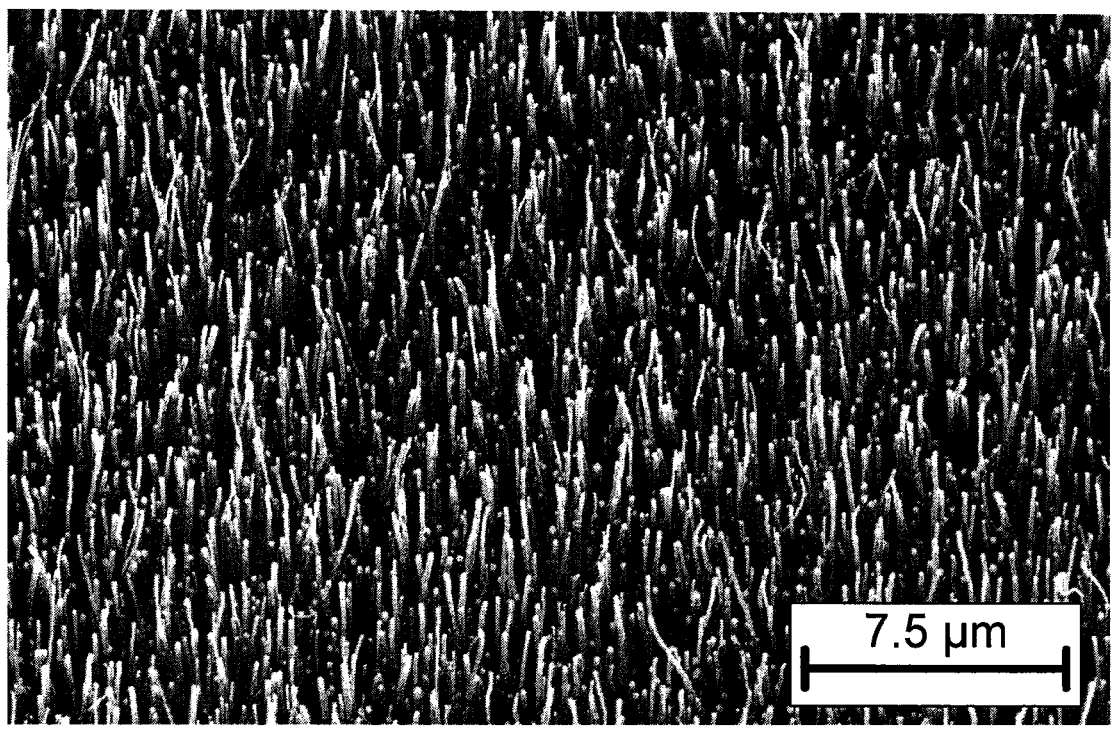
FIG. 3 is a scanning electron microscope image of a layer containing carbon nanotubes in accordance with some embodiments.

FIG. 3 is a scanning electron microscope image of a layer containing carbon nanotubes in accordance with some embodiments.

In some embodiments, the carbon nanotubes 116 have an average diameter between 60 nm and 200 nm. In some embodiments, the carbon nanotubes have an average diameter between 100 nm and 150 nm. In some embodiments, the carbon nanotubes 116 have an average length between 5 and 50 μm. In some embodiments, the carbon nanotubes have an average length between 25 and 45 μm. In some embodiments, the carbon nanotubes 116 have a tip density between 10 and 40 nanotubes per μm$^2$. In some embodiments, the carbon nanotubes 116 have a surface area coverage density between 15 and 40 percent.

In some embodiments, substantially all (e.g., >85%) of the carbon nanotubes 116 are individually separated from each other. Although axial thermal conduction of carbon nanotubes is very high, lateral thermal conduction (in the non-axial direction from nanotube to nanotube) is not as good. In fact, it has been found that lateral contact between axially aligned nanotubes can reduce their effective axial thermal conductivity. If the number of carbon nanotubes attached to substrate is too high (for example, >40% carbon nanotube density) Van der Waals forces will create a bundle or mat situation resulting in poor thermal conduction. If, on the other hand the coverage density is too low (for example, <15%), thermal conduction will also be lower due to the reduced number of conducting nanotubes. A preferred range a coverage density is between about 15 and 40%, with 25% to 40% being most preferred. Thus, vertically aligned, individually separated, parallel carbon nanotubes with coverage between about 15 and 40%, may provide better overall thermal conduction than a bundle or mat of carbon nanotubes.

Figure 4A:
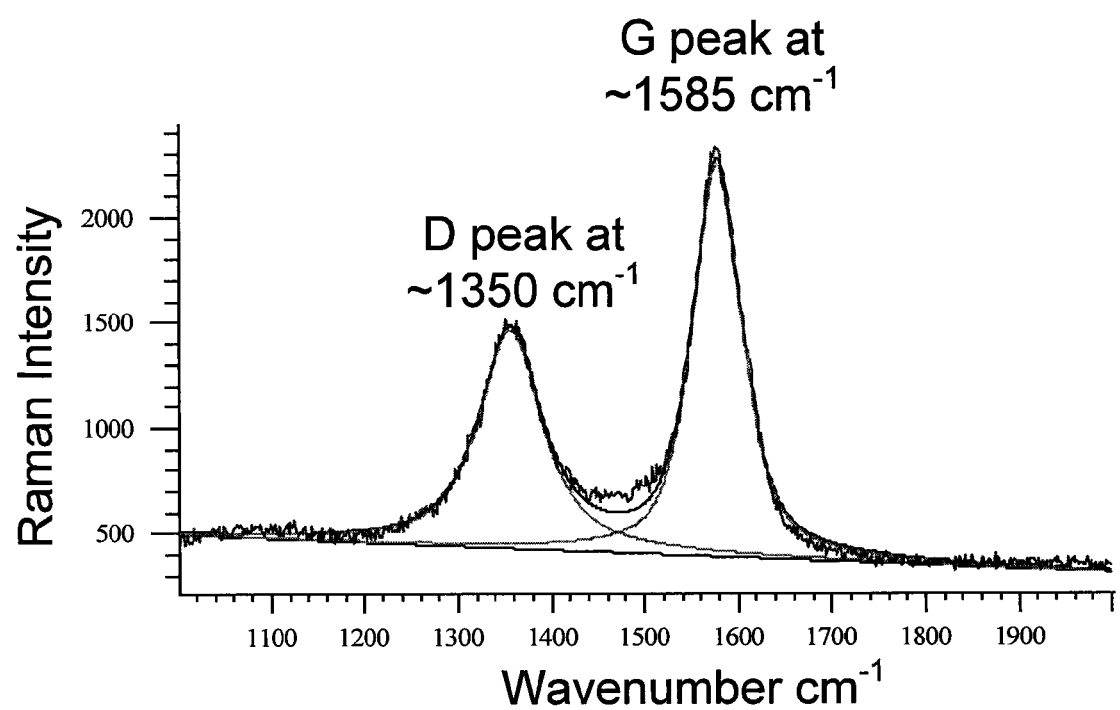
FIG. 4A is a Raman spectrum of a layer containing carbon nanotubes in accordance with some embodiments.

FIG. 4A is a Raman spectrum of a layer containing carbon nanotubes in accordance with some embodiments. The Raman spectrum of the layer 112 containing carbon nanotubes 116 has a D peak at ~1350 cm$^{-1}$ with an intensity $I_D$ and a G peak at ~1585 cm$^{-1}$ with an intensity $I_G$.

Figure 4B:
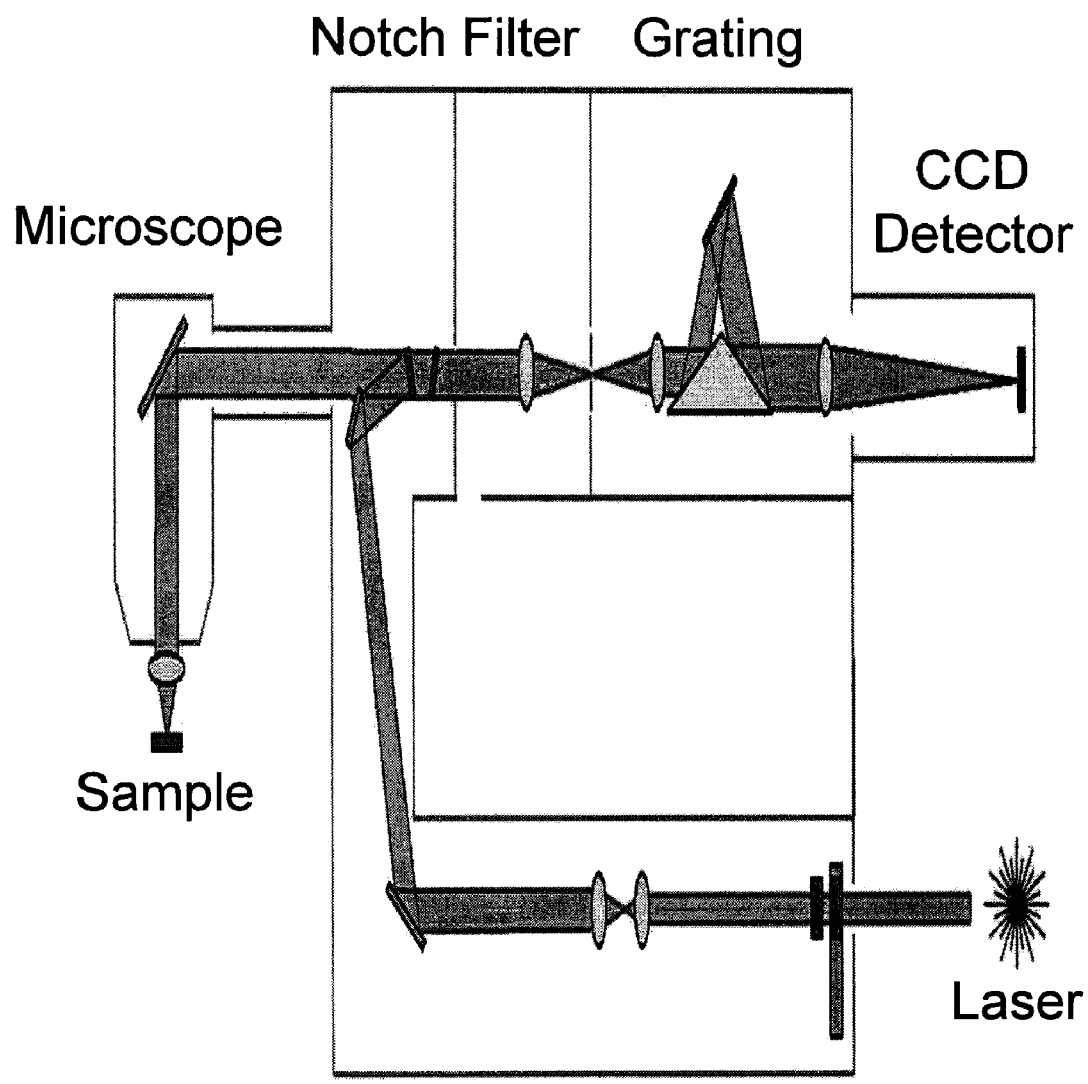
FIG. 4B is a schematic diagram of the experimental configuration for obtaining the Raman spectra in FIGS. 4A, 4C & 4D in accordance with some embodiments.
Figure 4C:
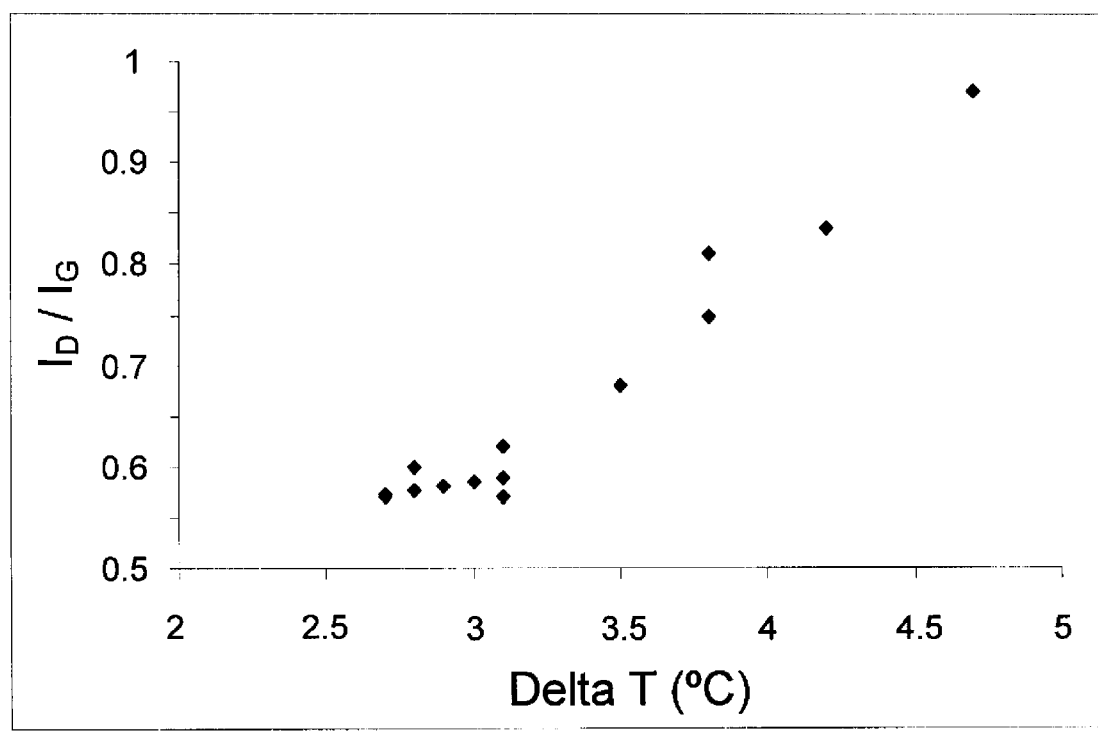
FIG. 4C is a plot of the Raman intensity ratio $I_D/I_G$ versus thermal performance for layers containing carbon nanotubes, where $I_D$ is the intensity of the D peak at ~1350 cm$^{-1}$ and is the intensity of the $I_G$ peak at ~1585 cm$^{-1}$, in accordance with some embodiments.
Figure 4D:
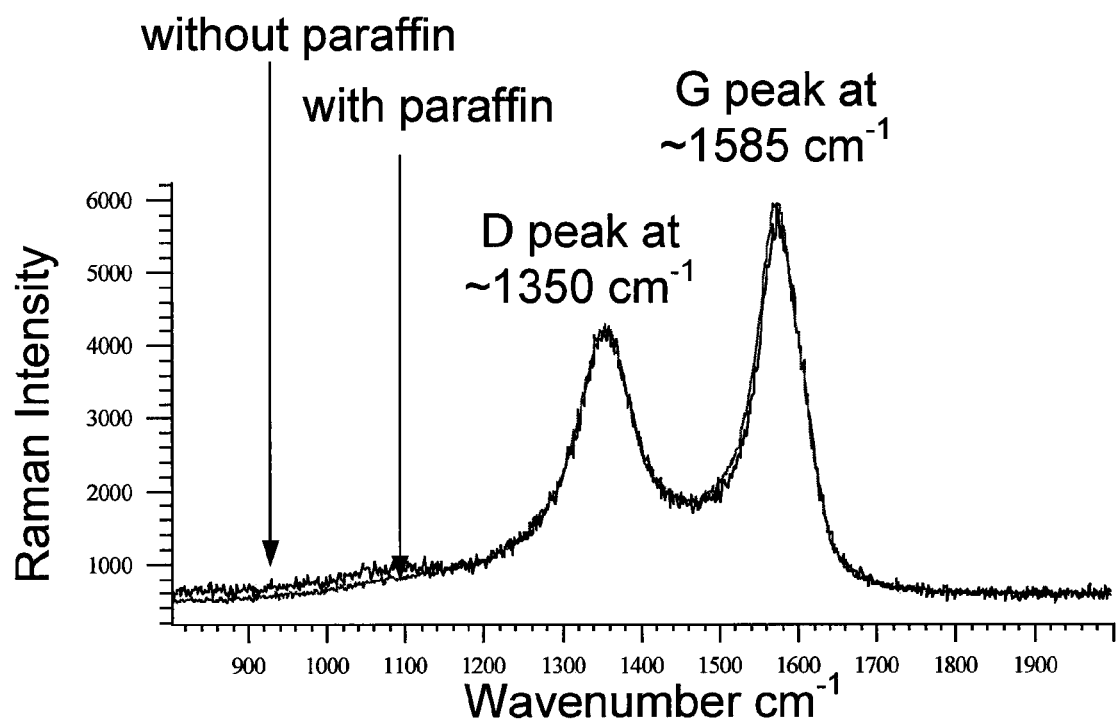
FIG. 4D shows Raman spectra of a layer containing carbon nanotubes with and without paraffin between the carbon nanotubes in accordance with some embodiments.

FIG. 4B is a schematic diagram of the experimental configuration for obtaining the Raman spectra in FIGS. 4A, 4C & 4D in accordance with some embodiments. A Renishaw inVia Raman microscope with a 514 nm laser beam used to obtain the Raman spectra. A ~10 mW, ~10 μm$^2$ laser spot was directed onto the sample with a 50× objective lens. The laser spot was configured to hit the carbon nanotubes in a direction that was parallel to the axes of the carbon nanotubes. The Raman spectra were analyzed using Renishaw WiRE 2.0 software.

FIG. 4C is a plot of the Raman intensity ratio $I_D/I_G$ versus thermal performance for layers containing carbon nanotubes, in accordance with some embodiments. We have found that the thermal performance of the layer containing carbon nanotubes depends strongly on the quality of the nanotubes grown, which, in turn, depends on the materials, layers, and growth conditions used. As shown in FIG. 4C, we have also found that Raman spectra from the layer of carbon nanotubes can be used to monitor the quality of the nanotubes. We have found that layers 112 with an intensity ratio $I_D/I_G$ of less than 0.7 at a laser excitation wavelength of 514 nm provide good thermal performance (e.g., 0.08 cm$^2$K/W or less for a 0.8 mm thick Cu substrate with layer 112, as described below), with an intensity ratio $I_D/I_G$ of less than 0.6 at a laser excitation wavelength of 514 nm being preferred. In FIG. 4C, the intensity ratio $I_D/I_G$ is plotted versus the temperature drop (Delta T, ° C.) across an ASTM 5470 thermal interface material tester containing identical copper substrates with different layers of carbon nanotubes. As shown in FIG. 4C, the temperature drop decreases (which corresponds to lower thermal resistance) as the $I_D/I_G$ intensity ratio decreases.

The Raman measurements may be taken with no interstitial material between the nanotubes (e.g., before a phase change material is placed between the carbon nanotubes or after such a phase change material is removed from between the carbon nanotubes).

The Raman measurements may also be taken with an interstitial material between the nanotubes if the interstitial material does not interfere with the D peak at ~1350 cm$^{-1}$ and the G peak at ~1585 cm$^{-1}$. For example, FIG. 4D shows Raman spectra of a layer containing carbon nanotubes with and without paraffin between the carbon nanotubes in accordance with some embodiments. The D and G peaks in the two spectra and the corresponding $I_D/I_G$ intensity ratios are essentially the same.

In some embodiments, a 0.8 mm thick copper substrate with a thermal interface material comprising: (a) the layer 112 containing carbon nanotubes 116 (with an average length of 25-45 μm) and (b) paraffin wax has a thermal resistance of 0.08 cm$^2$K/W or less. This thermal resistance is a summation of: (1) the bulk thermal resistance of the copper substrate (0.02 cm$^2$K/W for a 0.8 mm thick copper substrate), (2) the contact resistance at the interface between the thermal interface material and the copper substrate, (3) the bulk thermal resistance of the thermal interface material, and (4) the contact resistance at the interface between the thermal interface material and an integrated circuit or other solid-state device. Thus, the summation of (2)-(4) (i.e., the bulk thermal resistance of the thermal interface material and the two contact resistances associated with the thermal interface material) is 0.06 cm$^2$K/W or less. In some embodiments, for a thermal interface material comprising (a) the layer 112 containing carbon nanotubes 116 (with an average length of 5-10 μm) and (b) paraffin wax, the sum of the bulk thermal resistance of the thermal interface material and the two contact resistances associated with the thermal interface material is 0.03 cm$^2$K/W or less. In some embodiments, the sum of the bulk thermal resistance of the thermal interface material and the two contact resistances associated with the thermal interface material is 0.02 cm$^2$K/W or less. In some embodiments, the sum of the bulk thermal resistance of the thermal interface material and the two contact resistances associated with the thermal interface material is between 0.02-0.06 cm$^2$K/W. These values are better than what is achieved with conventional thermal interface materials and with prior thermal interface materials that include a layer of carbon nanotubes on a single surface of a copper substrate.

In testing thermal interface materials, the "solid-state device" referred to in the phrase "contact resistance between the thermal interface material and a/the solid-state device" may be a thermal test vehicle (TTV, e.g., a non-functional IC package that uses one or more heater resistors to simulate the power dissipation of a live IC), a heated copper block (e.g., in an ASTM D 5470 thermal interface material tester), or other equivalent to a solid-state device for testing purposes. Thus, in the specification and claims, the "contact resistance between the thermal interface material and a/the solid-state device" includes the contact resistance between the thermal interface material and a solid-state device (e.g., an IC, light emitting diode, laser, power transistor, RF device, or solar cell), a TTV, a copper block in a thermal interface material tester, or other equivalents to a solid-state device for testing purposes.

Figure 5:
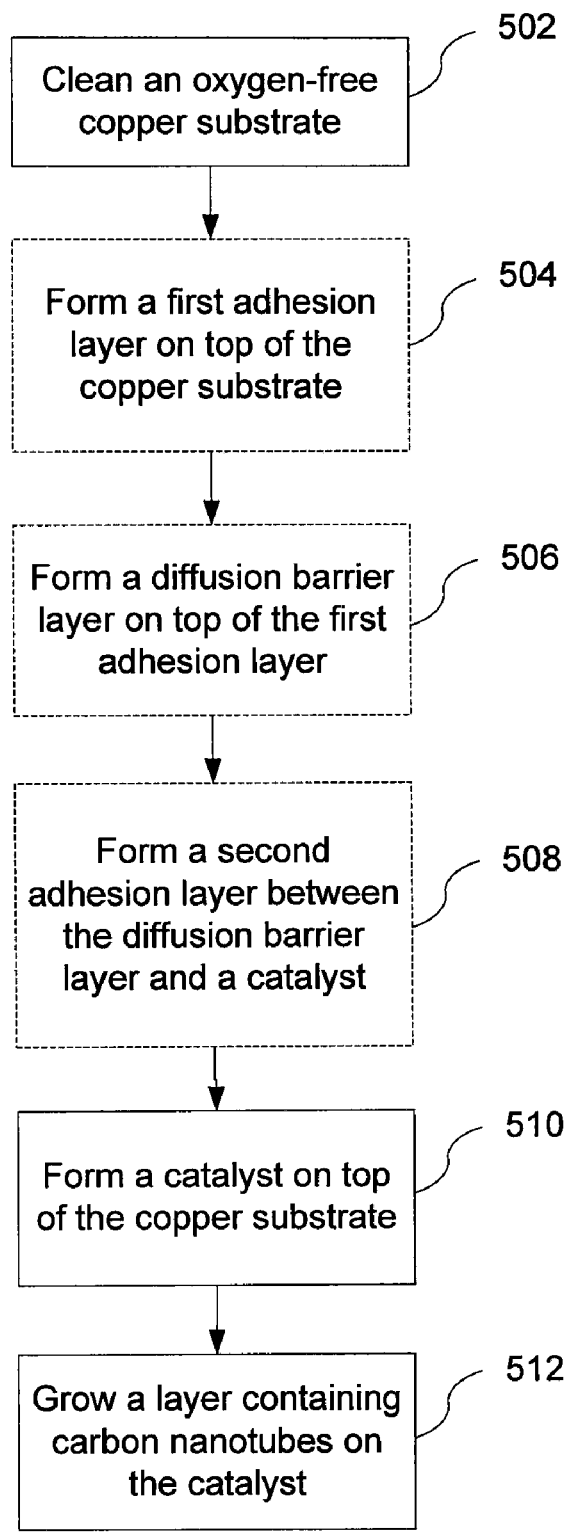
FIG. 5 is a flow diagram illustrating a process for making a copper substrate with a layer containing carbon nanotubes in accordance with some embodiments.

FIG. 5 is a flow diagram illustrating a process for making a copper substrate with a layer containing carbon nanotubes in accordance with some embodiments.

An oxygen-free copper substrate 102 is cleaned (502).

In some embodiments, cleaning the oxygen-free copper substrate 102 comprises exposing the substrate 102 to a wet chemical bath. In some embodiments, the wet chemical bath comprises citric acid. In some embodiments, the wet chemical bath is a 100:1 mixture of 5% citric acid and hydrogen peroxide.

In some embodiments, cleaning the oxygen-free copper substrate 102 comprises sputter cleaning the copper substrate.

In some embodiments, a plasma etch step is used to remove contaminants from the oxygen-free copper substrate 102.

We have found that using an oxygen-free copper substrate and thoroughly cleaning the substrate to remove grease, oxides, and other contaminants greatly increases the uniformity and quality of the subsequently grown layer of carbon nanotubes.

In some embodiments, the copper substrate has a shape that is configured to fit in a recessed cavity in a heat spreader (e.g., 202 in FIG. 2). Using a copper substrate with this shape enables a layer of carbon nanotubes to be grown on the copper substrate in an optimum manner, without concern for how the nanotube growth conditions may alter the dimensions, surfaces, and/or mechanical properties of the heat spreader.

In some embodiments, a first adhesion layer 104 is formed (504) on top of the copper substrate 102.

In some embodiments, a diffusion barrier layer 106 is formed (506) on top of the first adhesion layer 104.

In some embodiments, a second adhesion layer 108 is formed (508) between the diffusion barrier layer 106 and the catalyst 110. In some embodiments, the second adhesion layer 108 is formed by sputtering.

A catalyst 110 is formed (510) on top of the copper substrate 102.

In some embodiments, the first adhesion layer 104, the diffusion barrier layer 106, the second adhesion layer 108, and the catalyst 110 are formed by sputtering. In some embodiments, the first adhesion layer 104, the diffusion barrier layer 106, the second adhesion layer 108, and the catalyst 110 are formed by sequentially sputtering each respective layer.

If there is no second adhesion layer, in some embodiments, the first adhesion layer 104, the diffusion barrier layer 106, and the catalyst 110 are formed by sputtering. If there is no second adhesion layer, in some embodiments, the first adhesion layer 104, the diffusion barrier layer 106, and the catalyst 110 are formed by sequentially sputtering each respective layer.

Other deposition methods, such as electron beam evaporation, may be used to form the first adhesion layer 104, the diffusion barrier layer 106, the second adhesion layer 108, and/or the catalyst 110. The uniformity and thickness of each of these layers, especially the catalyst 110, is preferably kept within 10% total variation to promote a uniform catalyst nucleation process, which promotes individual separation of carbon nanotubes in the layer 112 containing carbon nanotubes. In some embodiments, the uniformity and thickness of the catalyst 110 is kept within 5% total variation.

A layer 112 containing carbon nanotubes is grown (512) on the catalyst 110. As is known in the art, carbon nanotubes may form via either tip growth or base growth on the catalyst. As used in the specification and claims, growing carbon nanotubes "on the catalyst" includes tip growth, base growth, or mixtures thereof.

In some embodiments, growing the layer containing carbon nanotubes comprises a temperature ramp in an inert atmosphere followed by nanotube growth in a carbon-containing atmosphere.

In some embodiments, the temperature ramp includes ramping the temperature between 600 and 800° C. in 5 minutes or less. In some embodiments, the temperature ramp includes ramping the temperature between 600 and 800° C. in 2 minutes or less. We have found that a fast temperature ramp between 600 and 800° C. promotes a uniform catalyst nucleation process, which promotes individual separation of carbon nanotubes in the layer 112 containing carbon nanotubes.

In some embodiments, the inert atmosphere comprises argon or nitrogen.

In some embodiments, nanotube growth in the carbon-containing atmosphere comprises plasma-enhanced chemical vapor deposition (PECVD) of carbon nanotubes. In some embodiments, the PECVD comprises flowing $NH_3$ and $C_2H_2$ gases over the catalyst at a temperature between 700 and 900° C. in a total pressure between 1 and 10 torr. An electric field created by a DC plasma may be used to align the carbon nanotubes during the PECVD growth process. In some embodiments, nanotube growth in the carbon-containing atmosphere comprises thermal chemical vapor deposition (CVD) of carbon nanotubes.

In some embodiments, the carbon nanotubes are annealed after the growth process to release thermal stresses and to remove defects in the nanotube layer (e.g., at temperatures ranging from 700° C. to 1000° C.).

In some embodiments, a Raman spectrum of the layer containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

Figure 6A:
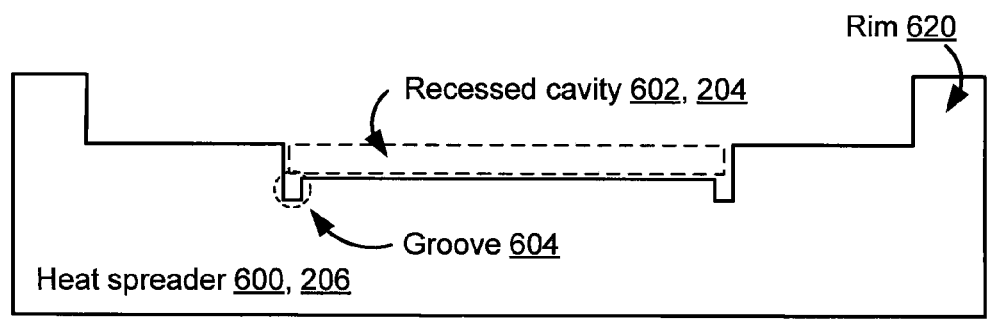
FIGS. 6A & 6B illustrate side and top views, respectively, of a heat spreader with a recessed cavity in accordance with some embodiments.
Figure 6B:
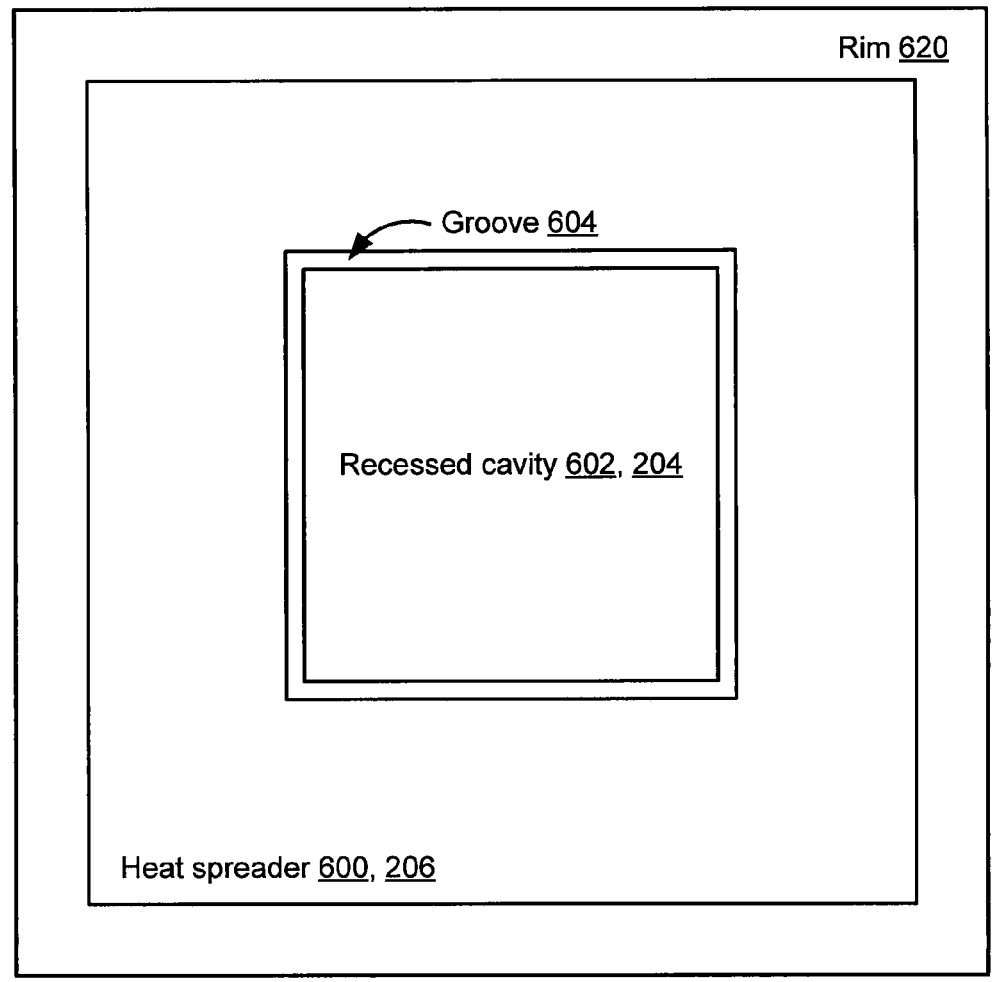

FIGS. 6A & 6B illustrate side and top views, respectively, of a heat spreader 600 with a recessed cavity 602 in accordance with some embodiments. The recessed cavity 602 is configured to incorporate a substrate with a thermal interface material (e.g., 102 and/or 202). In some embodiments, the heat spreader 600, 206 does not have a rim 620.

In some embodiments, the heat spreader 600 comprises copper, the substrate (e.g., 102 and/or 202) comprises copper, and the thermal interface material comprises carbon nanotubes (e.g., 116). The copper may be pure copper or a copper alloy.

In some embodiments, the cavity 602, 204 has a cross-sectional area (e.g., 212) that substantially corresponds to the cross-sectional area of an integrated circuit or other solid-state device. In some embodiments, the cavity 602, 204 has a depth (e.g., 214) that substantially corresponds to the thickness of the substrate (e.g., 210). In some embodiments, the cavity 602, 204 has a depth that substantially corresponds to a combined thickness of a bonding layer and the substrate. In some embodiments, the cavity 602, 204 has a depth of 1 mm or less.

In some embodiments, the cavity includes one or more grooves 604 configured to contain excess material for bonding the substrate (e.g., 102 or 202) in the cavity.

In some embodiments, the substrate 202 has a cross-sectional area 208 and thickness 210 that substantially correspond to the cross-sectional area 204 and depth 214 of the recessed cavity 602, 204.

Figure 7:
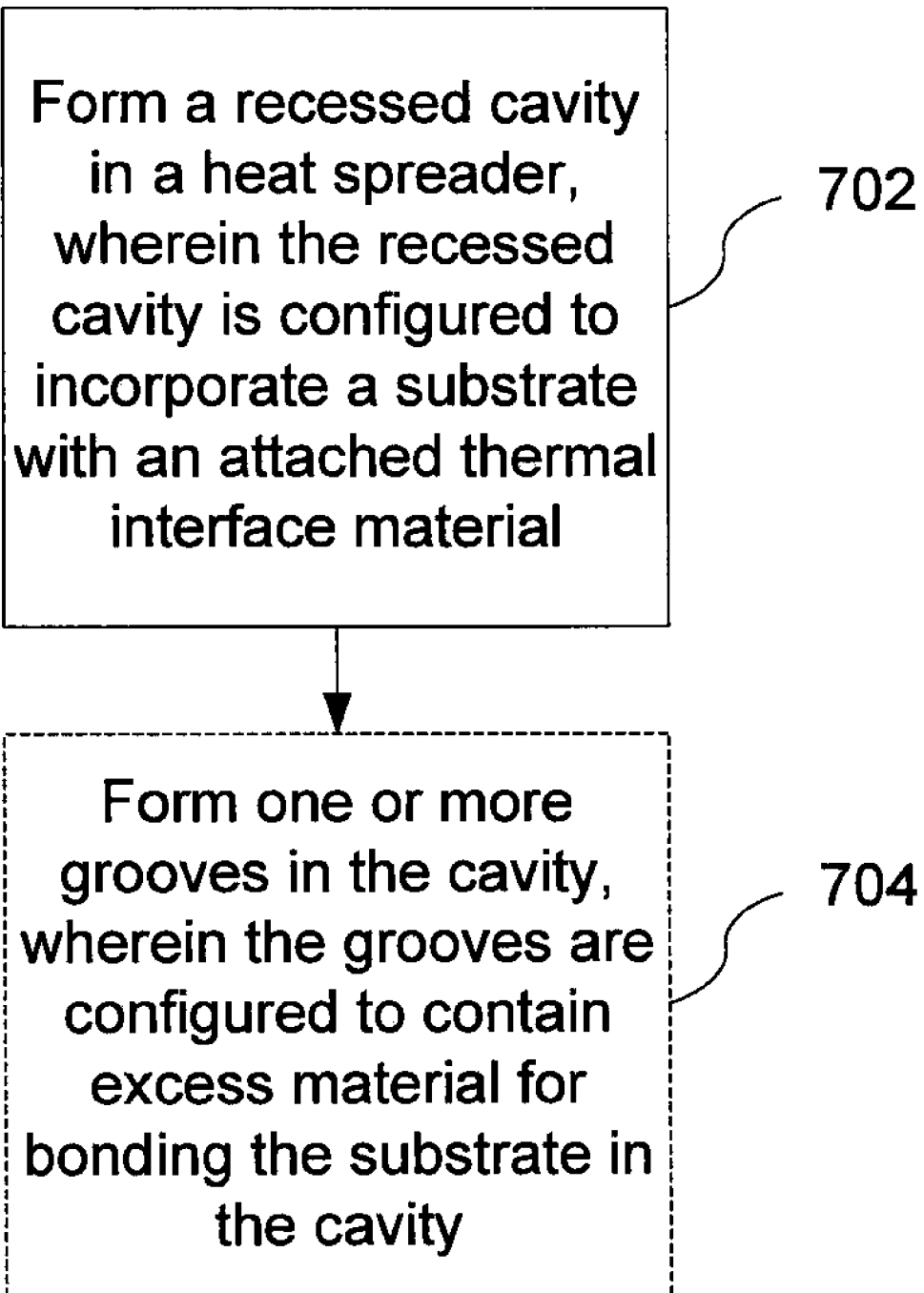
FIG. 7 is a flow diagram illustrating a process for making a heat spreader with a recessed cavity in accordance with some embodiments.

FIG. 7 is a flow diagram illustrating a process for making a heat spreader with a recessed cavity in accordance with some embodiments.

A recessed cavity is formed (702) in a heat spreader. The recessed cavity is configured to incorporate a substrate with an attached thermal interface material. In some embodiments, the cavity is formed by machining the heat spreader. In some embodiments, the cavity is formed by coining, stamping or injection molding.

In some embodiments, one or more grooves are formed (704) in the cavity. The grooves are configured to contain excess material (e.g., indium or an indium alloy) for bonding the substrate in the cavity.

Figure 8:
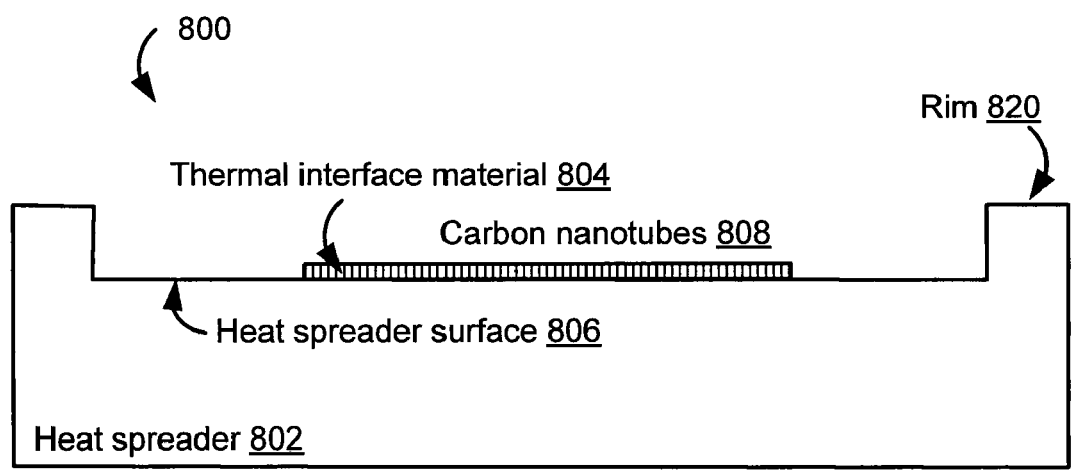
FIG. 8 illustrates a side view of an article of manufacture that includes a heat spreader with a thermal interface material in accordance with some embodiments.

FIG. 8 illustrates a side view of an article of manufacture 800 that includes a heat spreader 802 with a thermal interface material 804 in accordance with some embodiments. In some embodiments, the heat spreader 802 does not have a rim 820. In some embodiments, the heat spreader 800 comprises copper or other high-thermal conductivity metal. The copper may comprise pure copper, an alloy containing copper, a mixture containing copper (e.g., Cu—W), and/or a composite containing copper (e.g., Cu—Mo laminate) whose shape and mechanical properties remain substantially the same before and after carbon nanotube formation at elevated temperatures.

The heat spreader 802 has a surface 806 that is configured to face an integrated circuit or other solid-state device.

The thermal interface material 804, which is attached to the heat spreader 802, comprises a layer of carbon nanotubes 808. The carbon nanotubes 808 are oriented substantially perpendicular to the surface 806 of the heat spreader that is configured to face an integrated circuit or other solid-state-device. A Raman spectrum of the layer of carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

Figure 9:
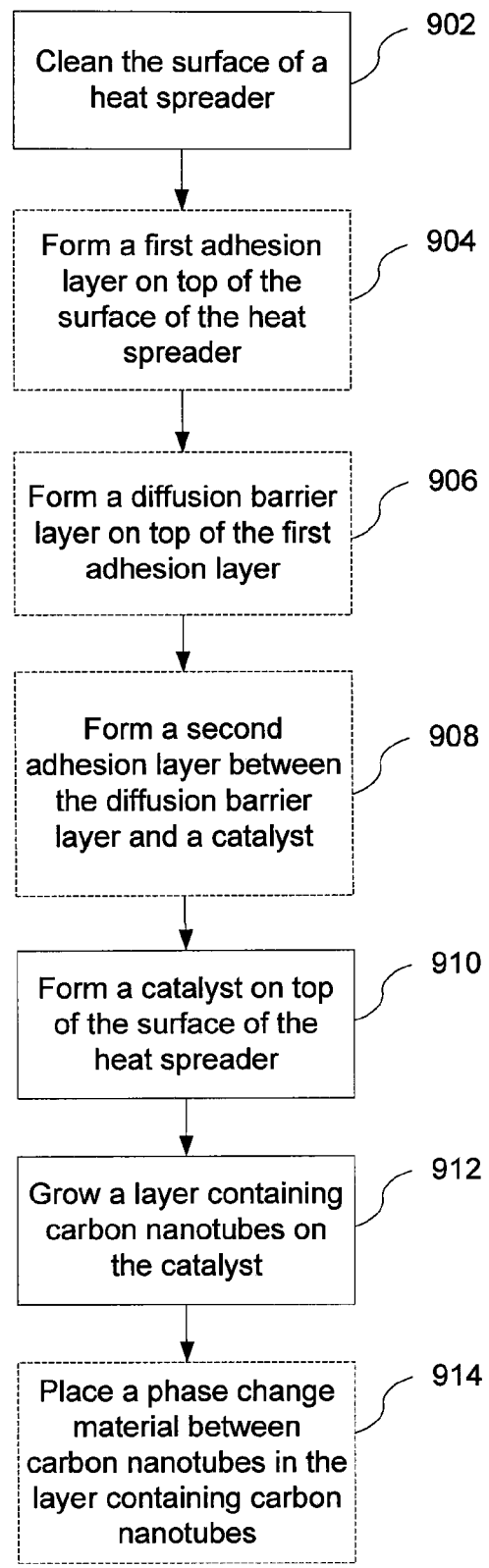
FIG. 9 is a flow diagram illustrating a process for making a heat spreader with a thermal interface material in accordance with some embodiments.

In some embodiments, the thermal interfaced material 804 is attached to the heat spreader 802 by growing the layer of carbon nanotubes 808 on the heat spreader 802 (FIG. 9). A field mask may be used to restrict carbon nanotube growth to a particular area on the heat spreader.

Figure 10:
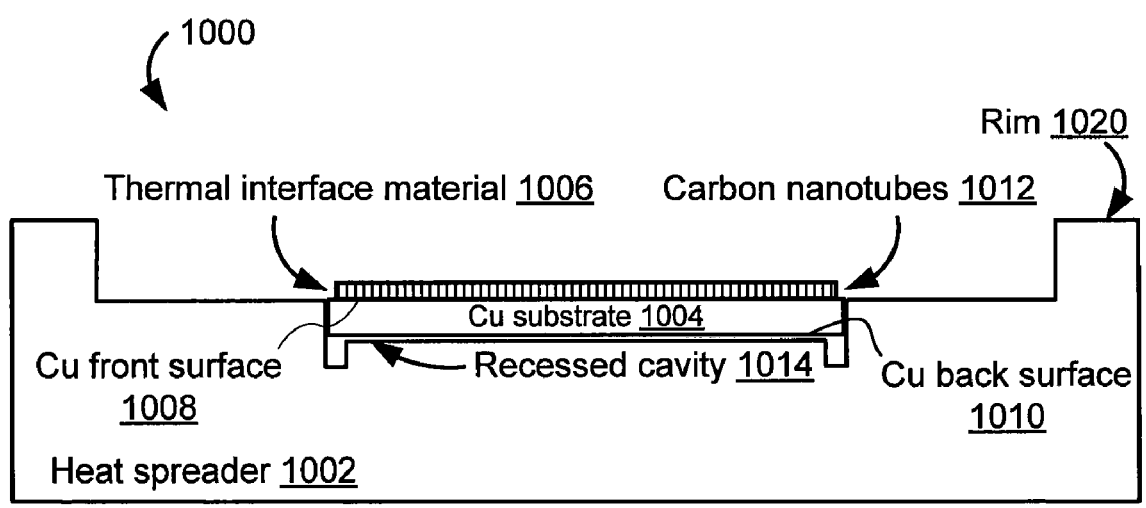
FIG. 10 illustrates a side view of an article of manufacture that includes a heat spreader with a recessed cavity, a copper substrate, and a thermal interface material in accordance with some embodiments.
Figure 11:
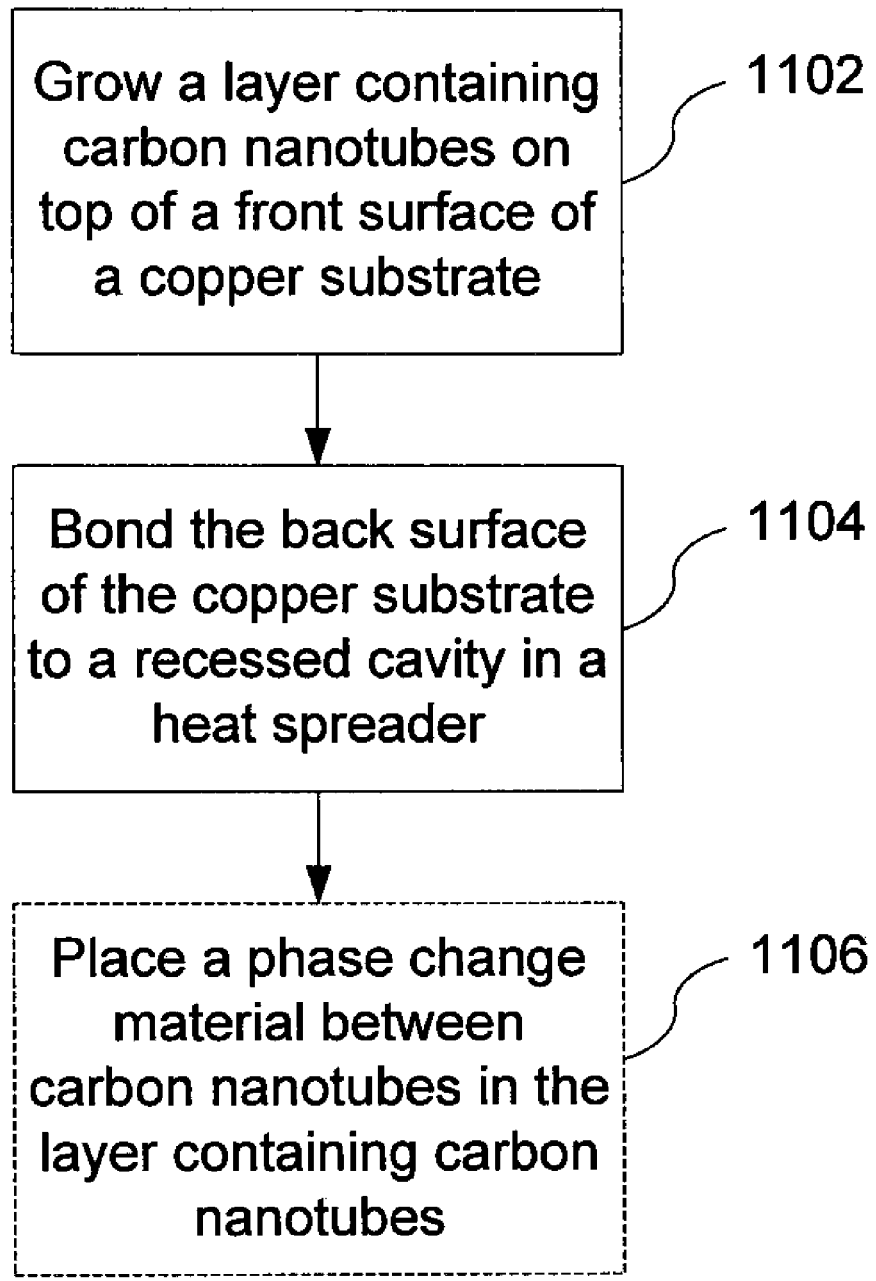
FIG. 11 is a flow diagram illustrating a process for making an article of manufacture that includes a heat spreader with a recessed cavity, a copper substrate, and a thermal interface material in accordance with some embodiments.

In some embodiments, the thermal interface material is attached to the heat spreader by growing the layer of carbon nanotubes on a copper substrate and attaching the copper substrate to the heat spreader (e.g., FIGS. 10 & 11). In some embodiments, the copper substrate is attached to the heat spreader by bonding the substrate to a recessed cavity in the heat spreader.

In some embodiments, the thermal interface material 804 comprises a phase change material located between the carbon nanotubes 808. In some embodiments, the phase change material comprises a wax. In some embodiments, the phase change material comprises paraffin. We believe that phase change materials like paraffin improve the thermal performance of the thermal interface material 804 by filling the air gap between carbon nanotubes with lengths that do not make thermal contact with an opposing IC or other solid-state device surface and by wetting and separating the carbon nanotubes when pressed to conform with asperities on the opposing surface.

The article of manufacture 800 may be reworkable, which increases yields and reduces manufacturing costs. In some embodiments, an integrated circuit or other solid-state device may be removably connected to the thermal interface material 804. In some embodiments, the thermal interface material 804 is configured to enable an integrated circuit or other solid-state device to be connected to the thermal interface material, disconnected from the thermal interface material, and then reconnected to the thermal interface material. In some embodiments, the article of manufacture 800 is configured to be reused to cool a succession of integrated circuits or other solid-state devices.

In some embodiments, the summation of the bulk thermal resistance of the thermal interface material 804 and the two contact resistances associated with the thermal interface material is 0.06 cm$^2$K/W or less. In some embodiments, the summation of the bulk thermal resistance of the thermal interface material 804 and the two contact resistances associated with the thermal interface material is 0.03 cm$^2$K/W or less. In some embodiments, the summation of the bulk thermal resistance of the thermal interface material and the two contact resistances associated with the thermal interface material is 0.02 cm$^2$K/W or less. In some embodiments, the summation has a value between 0.02-0.06 cm$^2$K/W. These values are better than what is achieved with conventional thermal interface materials and with prior thermal interface materials that include a layer of carbon nanotubes on a single surface of a copper substrate.

FIG. 9 is a flow diagram illustrating a process for making a heat spreader 802 with a thermal interface material 804 in accordance with some embodiments. The process described here is analogous to that described in FIG. 5, except a field mask may be used to restrict carbon nanotube growth to a particular area on the heat spreader.

The surface 806 of a heat spreader 802 is cleaned (902). The heat spreader 802 comprises copper with less than 40 ppm oxygen. In some embodiments, the heat spreader 802 comprises copper with 10 ppm oxygen or less.

In some embodiments, cleaning the surface of the heat spreader comprises exposing the surface of the heat spreader to a wet chemical bath. In some embodiments, the wet chemical bath comprises citric acid. In some embodiments, the wet chemical bath is a 100:1 mixture of 5% citric acid and hydrogen peroxide.

In some embodiments, cleaning the surface of the heat spreader comprises sputter cleaning the surface of the heat spreader.

In some embodiments, a plasma etch step is used to remove contaminants from the surface of the heat spreader.

We have found that using an oxygen-free copper heat spreader and thoroughly cleaning the surface to remove grease, oxides, and other contaminants greatly increases the uniformity and quality of the subsequently grown layer of carbon nanotubes.

In some embodiments, a first adhesion layer is formed (904) on top of the surface of the heat spreader.

In some embodiments, a diffusion barrier layer is formed (906) on top of the first adhesion layer.

In some embodiments, a second adhesion layer is formed (908) between the diffusion barrier layer and a catalyst. In some embodiments, the second adhesion layer is formed by sputtering.

A catalyst is formed (910) on top of the surface 806 of the heat spreader.

In some embodiments, the first adhesion layer, the diffusion barrier layer, the second adhesion layer, and the catalyst are formed by sputtering. In some embodiments, the first adhesion layer, the diffusion barrier layer, the second adhesion layer, and the catalyst are formed by sequentially sputtering each respective layer.

If there is no second adhesion layer, in some embodiments, the first adhesion layer, the diffusion barrier layer, and the catalyst are formed by sputtering. If there is no second adhesion layer, in some embodiments, the first adhesion layer, the diffusion barrier layer, and the catalyst are formed by sequentially sputtering each respective layer.

Other deposition methods, such as electron beam evaporation, may be used to form the first adhesion layer, the diffusion barrier layer, the second adhesion layer, and/or the catalyst. The uniformity and thickness of each of these layers, especially the catalyst, is preferably kept within 10% total variation to promote a uniform catalyst nucleation process, which promotes individual separation of carbon nanotubes in the layer containing carbon nanotubes. In some embodiments, the uniformity and thickness of the catalyst is kept within 5% total variation.

A layer containing carbon nanotubes is grown (912) on the catalyst. As is known in the art, carbon nanotubes may form via either tip growth or base growth on the catalyst. As used in the specification and claims, growing carbon nanotubes "on the catalyst" includes tip growth, base growth, or mixtures thereof.

A Raman spectrum of the layer containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, growing the layer containing carbon nanotubes comprises a temperature ramp in an inert atmosphere followed by nanotube growth in a carbon-containing atmosphere.

In some embodiments, the temperature ramp includes ramping the temperature between 600 and 800° C. in 5 minutes or less. In some embodiments, the temperature ramp includes ramping the temperature between 600 and 800° C. in 2 minutes or less. We have found that a fast temperature ramp between 600 and 800° C. promotes a uniform catalyst nucleation process, which promotes individual separation of carbon nanotubes in the layer 112 containing carbon nanotubes.

In some embodiments, the inert atmosphere comprises argon or nitrogen.

In some embodiments, nanotube growth in the carbon-containing atmosphere comprises plasma-enhanced chemical vapor deposition (PECVD) of carbon nanotubes. In some embodiments, the PECVD comprises flowing $NH_3$ and $C_2H_2$ gases over the catalyst at a temperature between 700 and 900° C. in a total pressure between 1 and 10 torr. An electric field created by a DC plasma may be used to align the carbon nanotubes during the PECVD growth process. In some embodiments, nanotube growth in the carbon-containing atmosphere comprises thermal chemical vapor deposition (CVD) of carbon nanotubes.

In some embodiments, the carbon nanotubes are annealed after the growth process to release thermal stresses and to remove defects in the nanotube layer (e.g., at temperatures ranging from 700° C. to 1000° C.).

In some embodiments, a phase change material is placed (914) between carbon nanotubes in the layer containing carbon nanotubes. In some embodiments, the phase change material comprises a wax. In some embodiments, the phase change material comprises paraffin. In some embodiments, adsorption via capillary forces is used to place the phase change material in the space between the carbon nanotubes. As noted above, we believe that phase change materials like paraffin improve the thermal performance of the thermal interface material by filling the air gap between carbon nanotubes with lengths that do not make thermal contact with an opposing IC or other solid-state device surface and by wetting and separating the carbon nanotubes when pressed to conform with asperities on the opposing surface.

FIG. 10 illustrates a side view of an article of manufacture 1000 that includes a heat spreader 1002 with a recessed cavity 1014, a copper substrate 1004, and a thermal interface material 1006 in accordance with some embodiments. In some embodiments, the heat spreader 1002 does not have a rim 1020.

The copper substrate 1004 has a front surface 1008 and a back surface 1010. The back surface 1010 is bonded to the recessed cavity 1014.

The thermal interface material 1006, which is attached to the front surface 1008 of the copper substrate, comprises a layer of carbon nanotubes 1012. The carbon nanotubes are oriented substantially perpendicular to the front surface of the copper substrate.

In some embodiments, the copper substrate 1004 substantially fills the recessed cavity 1014.

In some embodiments, the thermal interface material 1006 further comprises a phase change material located between the carbon nanotubes 1012. In some embodiments, the phase change material comprises a wax. In some embodiments, the phase change material comprises paraffin. We believe that phase change materials like paraffin improve the thermal performance of the thermal interface material 1006 by filling the air gap between carbon nanotubes with lengths that do not make thermal contact with an opposing IC or other solid-state device surface and by wetting and separating the carbon nanotubes when pressed to conform with asperities on the opposing surface.

In some embodiments, the layer of carbon nanotubes 1012 are attached to the front surface 1008 of the copper substrate by growing the nanotubes on the front surface of the copper substrate (e.g., as described with respect to FIG. 5).

In some embodiments, substantially all of the carbon nanotubes 1012 are individually separated from each other, as described above.

In some embodiments, a Raman spectrum of the layer of carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, the summation of the bulk thermal resistance of the thermal interface material 1006 and the two contact resistances associated with the thermal interface material is 0.06 cm$^2$K/W or less. In some embodiments, the summation of the bulk thermal resistance of the thermal interface material 804 and the two contact resistances associated with the thermal interface material is 0.03 cm$^2$K/W or less. In some embodiments, the summation of the bulk thermal resistance of the thermal interface material and the two contact resistances associated with the thermal interface material is 0.02 cm$^2$K/W or less. In some embodiments, the summation has a value between 0.02-0.06 cm$^2$K/W. These values are better than what is achieved with conventional thermal interface materials and with prior thermal interface materials that include a layer of carbon nanotubes on a single surface of a copper substrate.

FIG. 11 is a flow diagram illustrating a process for making an article of manufacture 1000 that includes a heat spreader 1002 with a recessed cavity 1014, a copper substrate 1004, and a thermal interface material 1006 in accordance with some embodiments.

A layer containing carbon nanotubes 1012 is grown (1102) on top of a front surface 1008 of a copper substrate 1004 (e.g., as described with respect to FIG. 5). The layer of carbon nanotubes 1012 are oriented substantially perpendicular to the front surface 1008 of the copper substrate 1004.

In some embodiments, a Raman spectrum of the layer of carbon nanotubes 1012 has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

The back surface 1010 of the copper substrate 1004 is bonded (1104) to the recessed cavity 1014 in the heat spreader 1002.

In some embodiments, a phase change material is placed (1106) between carbon nanotubes in the layer containing carbon nanotubes. In some embodiments, the phase change material comprises paraffin.

In some embodiments, the carbon nanotubes are planarized (e.g., by chemical mechanical polishing, microtoming, or plasma etching).

FIG. 12A is a flow diagram illustrating a process for bonding (1202) a back surface 1010 of a copper substrate 1004 to a recessed cavity 1014 in a heat spreader 1002 in accordance with some embodiments. A thermal interface material 1006 is attached to the front surface 1008 of the copper substrate 1004. The thermal interface material 1006 comprises a layer of carbon nanotubes 1012 oriented substantially perpendicular to the front surface of the copper substrate.

Figure 12B:
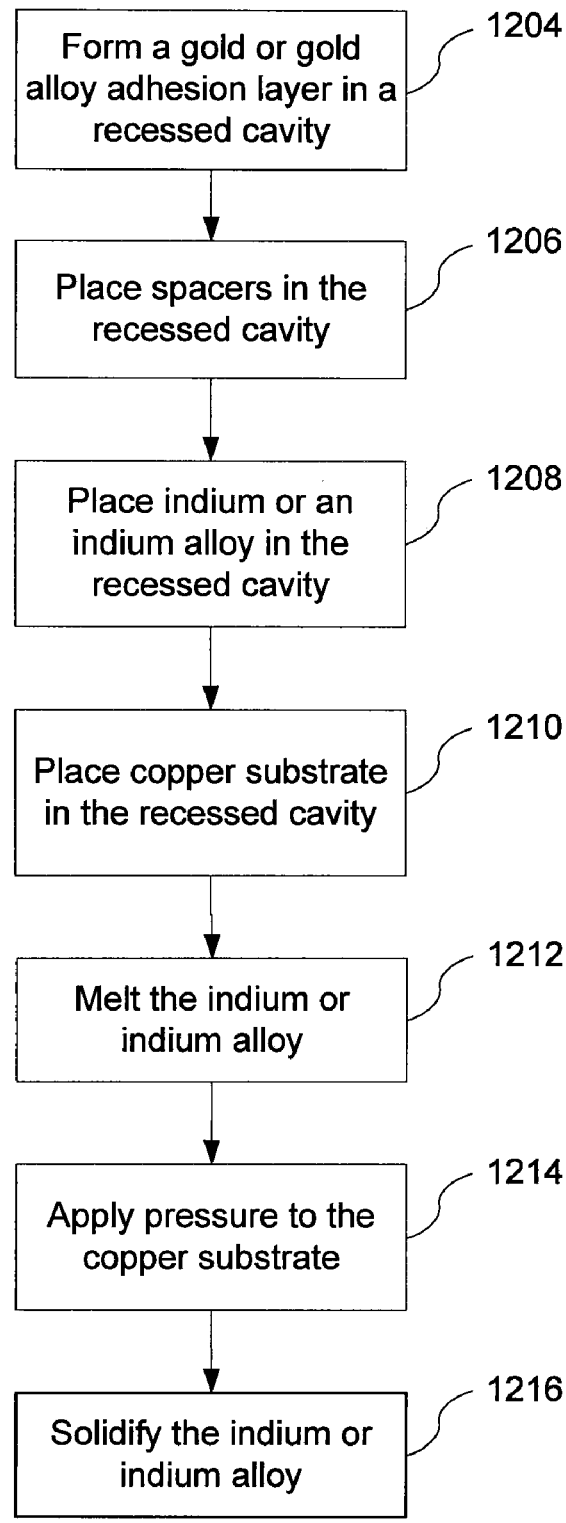
FIG. 12B is a flow diagram illustrating a process for bonding a back surface of a copper substrate to a recessed cavity in a heat spreader in accordance with some embodiments.

FIG. 12B is a flow diagram illustrating a process for bonding a back surface 1010 of a copper substrate 1004 to a recessed cavity 1014 in a heat spreader 1002 in accordance with some embodiments. In some embodiments, the bonding comprises:
  forming (1204) a gold or gold alloy adhesion layer in recessed cavity 1014 (e.g., by sputtering or electron evaporation);
  placing (1206) spacers (e.g., 25 μm diameter copper wire) in the recessed cavity 1014;
  placing (1208) indium or an indium alloy in the recessed cavity (e.g., a 50 μm thick indium foil for a (50−25=) 25 μm bond line thickness);
  placing (1210) the copper substrate 1004 in the recessed cavity 1014;
  melting (1212) the indium or indium alloy;
  applying (1214) pressure to the copper substrate (e.g., applying 2-5 lb. pressure); and
  solidifying (1216) the indium or indium alloy (e.g., by cooling to room temperature).

In some embodiments, the bonding comprises microwave bonding (e.g., as disclosed in U.S. Pat. Nos. 6,734,409 and 6,809,305), tin-lead solder bonding, or reactive bonding (e.g., as disclosed in U.S. Pat. No. 5,381,944).

FIG. 13A is a flow diagram illustrating a process for placing (1302) a phase change material between carbon nanotubes in a layer containing carbon nanotubes in accordance with some embodiments. A Raman spectrum of the layer containing carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

Figure 13B:
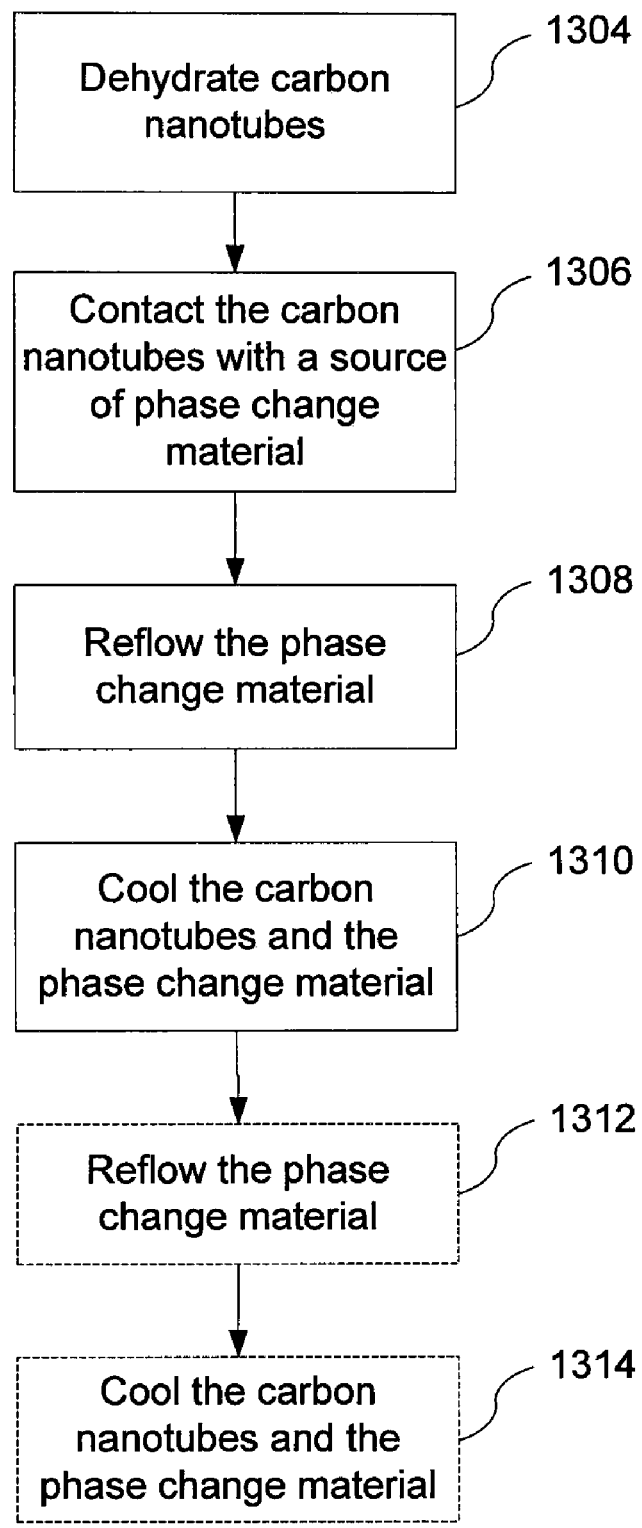
FIG. 13B is a flow diagram illustrating a process for placing a phase change material between carbon nanotubes in a layer containing carbon nanotubes in accordance with some embodiments.

FIG. 13B is a flow diagram illustrating a process for placing a phase change material between carbon nanotubes in a layer containing carbon nanotubes in accordance with some embodiments. In some embodiments, the placing comprises:
  dehydrating (1304) the carbon nanotubes (e.g., by placing an article with the layer containing carbon nanotubes on a heated surface at 100° C. for 5 minutes);
  contacting (1306) the carbon nanotubes with a source of phase change material (e.g., for paraffin wax, pressing a pre-waxed paper on to the tips of the carbon nanotubes with a flat surface at a temperature above the melting point of the paraffin wax);
  reflowing (1308) the phase change material;
  cooling (1310) the carbon nanotubes and phase change material (e.g., by quenching on a metal block); and
  optionally, reflowing (1312) the phase change material again and cooling (1314) the carbon nanotubes and phase change material one or more additional times.

Figure 14:
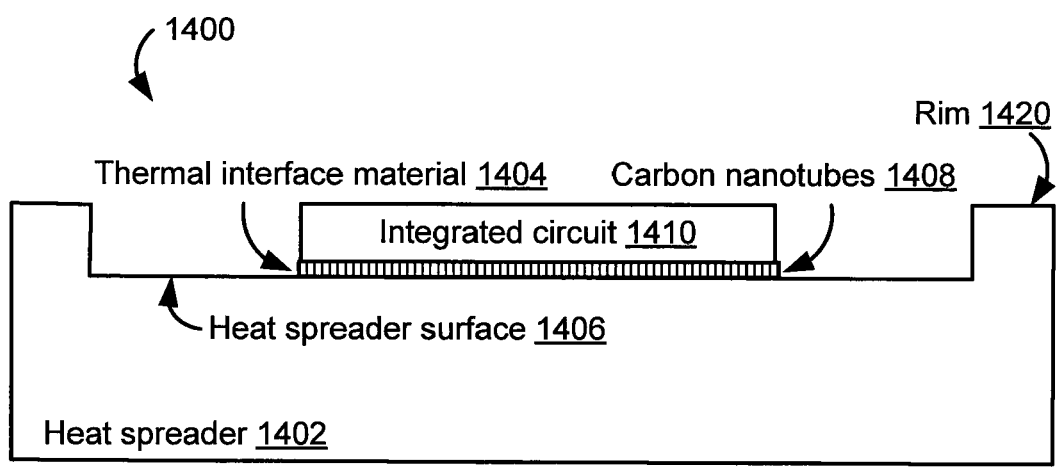
FIG. 14 illustrates a side view of an article of manufacture that includes a solid state-device (e.g., an integrated circuit) and a heat spreader with a thermal interface material in accordance with some embodiments.

FIG. 14 illustrates a side view of an article of manufacture 1400 that includes a solid-state device (e.g., integrated circuit 1410) and a heat spreader 1402 with a thermal interface material 1404 in accordance with some embodiments. The printed circuit board or other substrate that the integrated circuit 1410 is attached to is omitted for clarity. Article 1400 can further include additional components (not shown).

The heat spreader 1402 has a surface 1406 facing the integrated circuit 1410.

The thermal interface material 1404 is attached to the heat spreader 1402. The thermal interface material 1404 contacts the integrated circuit 1410. The thermal interface material 1404 comprises a layer of carbon nanotubes 1408. The carbon nanotubes are oriented substantially perpendicular to the surface 1406 of the heat spreader facing the integrated circuit. A field mask may be used to restrict carbon nanotube growth to a particular area on the heat spreader.

A Raman spectrum of the layer of carbon nanotubes has a D peak at ~1350 cm$^{-}$with an intensity $I_D$, a G peak at ~1585 cm$^{-}$with an intensity $I_G$, and an intensity ratio $I_D/I_G$ of less than 0.7 at a laser excitation wavelength of 514 nm. In some embodiments, the intensity ratio $I_D/I_G$ is less than 0.6.

In some embodiments, the article of manufacture is a computer, such as a server computer, client computer, desktop computer, laptop computer, handheld computer, personal digital assistant, cell phone, gaming console, or handheld gaming device.

Figure 15A:
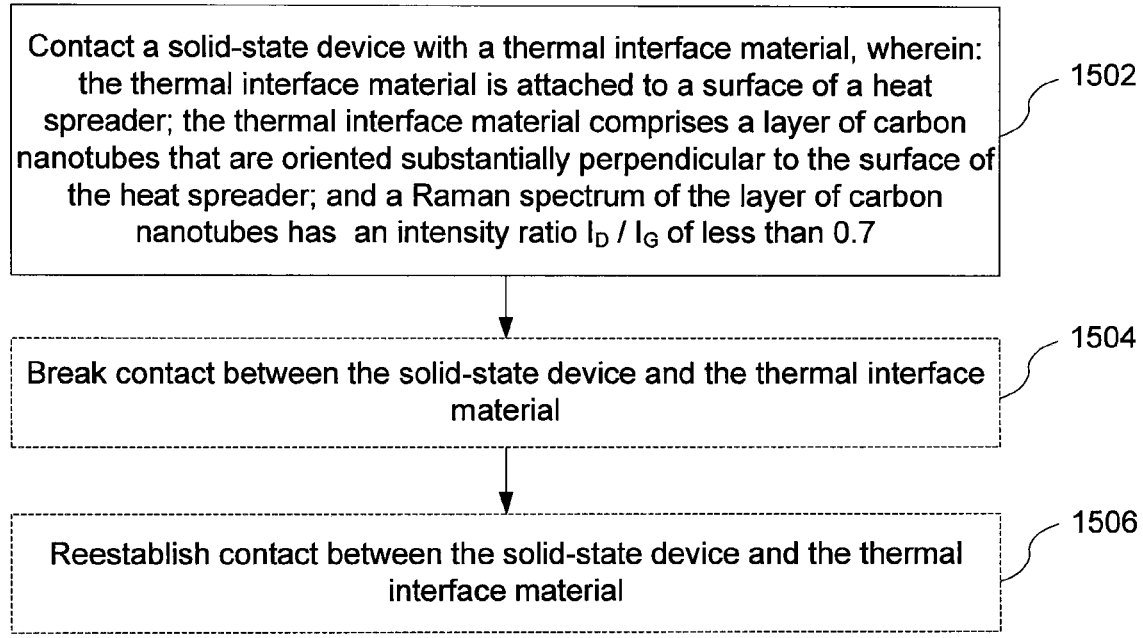
FIG. 15A is a flow diagram illustrating a process for contacting a solid state-device (e.g., an integrated circuit) with a thermal interface material in accordance with some embodiments.

FIG. 15A is a flow diagram illustrating a process for contacting (1502) a solid-state device (e.g., integrated circuit 1410) with a thermal interface material 1404 in accordance with some embodiments. The thermal interface material 1404 is attached to a surface 1406 of a heat spreader 1402. The thermal interface material 1404 comprises a layer of carbon nanotubes 1408 that are oriented substantially perpendicular to the surface 1406 of the heat spreader 1402.

A Raman spectrum of the layer of carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

The heat spreader 1402 and thermal interface material 1404 may be reworkable, which increases yields and reduces manufacturing costs. In some embodiments, contact between the solid-state device and the thermal interface material 1404 is broken (1504), and then contact between the solid-state device and the thermal interface material is reestablished (1506).

Figure 15B:
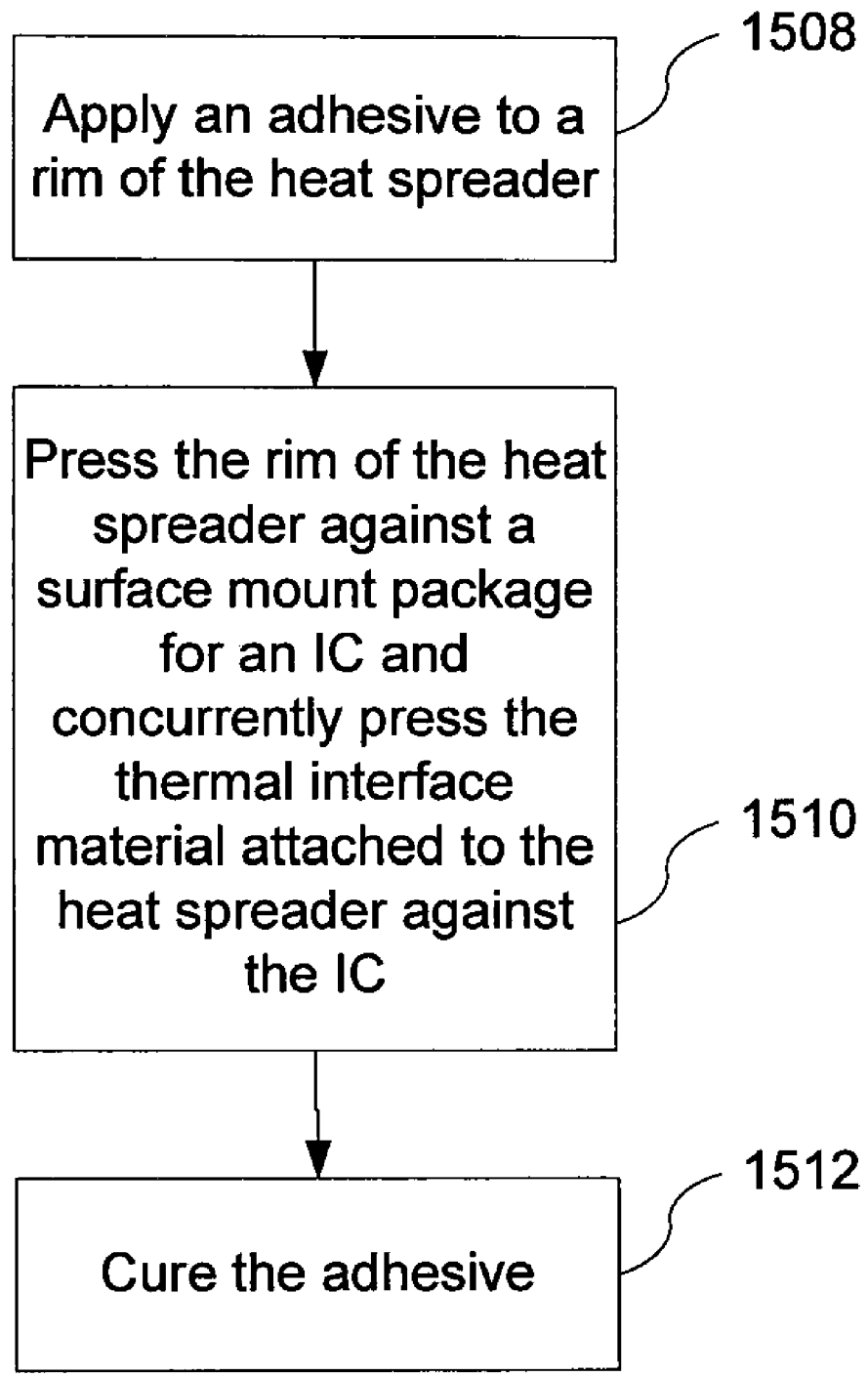
FIG. 15B is a flow diagram illustrating a process for contacting an integrated circuit with a thermal interface material in accordance with some embodiments.

FIG. 15B is a flow diagram illustrating a process for contacting an integrated circuit with a thermal interface material in accordance with some embodiments. In some embodiments, the contacting comprises:

applying (1508) an adhesive to a rim (e.g., 220, 620, 820, 1020, 1420, or 1620) of the heat spreader;

pressing (1510) the rim of the heat spreader against a surface mount package for an integrated circuit (e.g., a ball grid array (BGA) package) and concurrently pressing the thermal interface material attached to the heat spreader against the integrated circuit; and curing (1512) the adhesive.

In some embodiments, the layer of carbon nanotubes in the thermal interface material is designed to have sufficient compressibility so that the nanotubes contact the entire integrated circuit surface even if there are deviations in the flatness of the integrated circuit surface. For example, if the flatness of the integrated circuit surface being contacted varies by ±10 μm, the layer of carbon nanotubes can be made with an average length of 30-50 μm, an average diameter of 100-150 nm, and a Young's Modulus of 30-150 GPa so that the thermal resistance is low (e.g., 0.06 cm²K/W or less) when a pressure of 30-50 psi is applied to the heat spreader.

Figure 16:
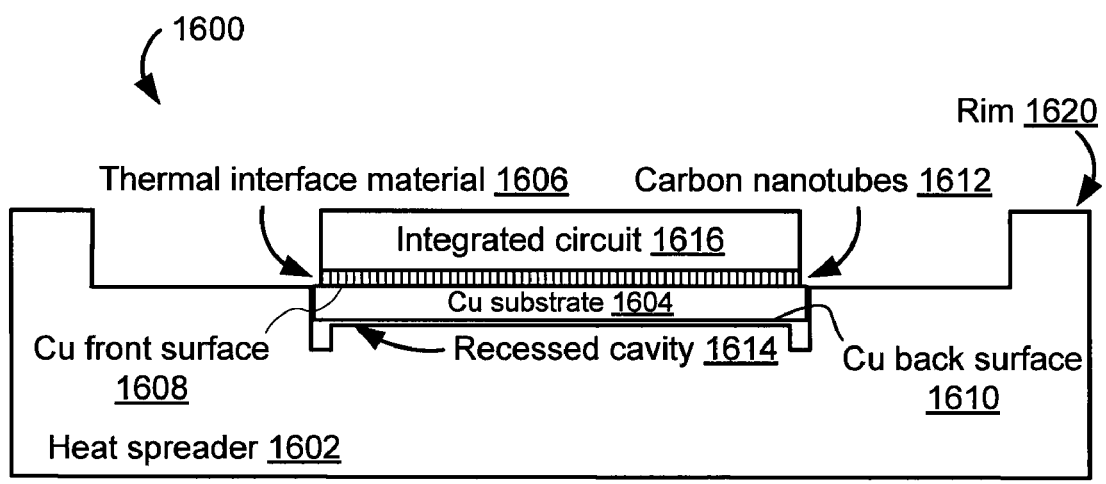
FIG. 16 illustrates a side view of an article of manufacture that includes a solid state-device (e.g., an integrated circuit), a heat spreader with a recessed cavity, a copper substrate, and a thermal interface material in accordance with some embodiments.

FIG. 16 illustrates a side view of an article of manufacture 1600 that includes a solid-state device (e.g., integrated circuit 1616), a heat spreader 1602 with a recessed cavity 1614, a copper substrate 1604, and a thermal interface material 1606 in accordance with some embodiments. The printed circuit board or other substrate that the integrated circuit 1616 is attached to is omitted for clarity. Article 1600 can further include additional components (not shown).

The copper substrate 1604 has a front surface 1608 and a back surface 1610. The back surface 1610 is bonded to the recessed cavity 1614.

The thermal interface material 1606 is attached to the front surface 1608 of the copper substrate 1640. The thermal interface material 1606 contacts the integrated circuit 1616. The thermal interface material 1606 comprises a layer of carbon nanotubes 1612. The carbon nanotubes are oriented substantially perpendicular to the front surface 1608 of the copper substrate 1604.

In some embodiments, the article of manufacture is a computer, such as a server computer, client computer, desktop computer, laptop computer, handheld computer, personal digital assistant, cell phone, gaming console, or handheld gaming device.

FIG. 17 is a flow diagram illustrating a process for contacting (1702) a solid-state device (e.g., integrated circuit 1616) with a thermal interface material 1606 in accordance with some embodiments. The thermal interface material 1606 is attached to a copper substrate 1604 with a front surface 1608 and a back surface 1610. The thermal interface material 1606 comprises a layer of carbon nanotubes 1612 that are oriented substantially perpendicular to the front surface 1608 of the copper substrate 1604. The back surface 1610 of the copper substrate 1604 is bonded to a recessed cavity 1614 in a heat spreader 1602.

In some embodiments, the contacting comprises the steps described above with respect to FIG. 15B.

Figure 18:
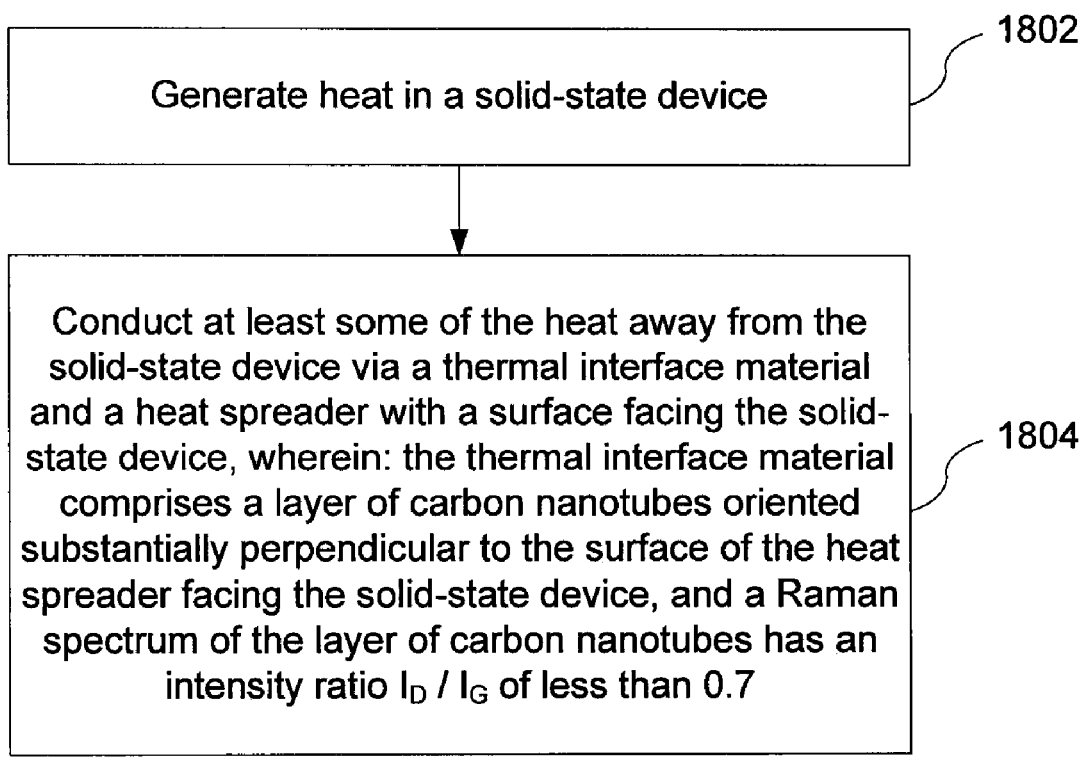
FIG. 18 is a flow diagram illustrating a process for removing heat from a solid state-device (e.g., an integrated circuit) in accordance with some embodiments.

FIG. 18 is a flow diagram illustrating a process for removing heat from a solid-state device (e.g. integrated circuit 1410) in accordance with some embodiments.

Heat is generated (1802) in a solid-state device (e.g., during the use of a computer containing integrated circuit 1410).

At least some of the heat is conducted (1804) away from the solid-state device via a thermal interface material 1404 and a heat spreader 1402 with a surface 1406 facing the solid-state device. The thermal interface material 1404 comprises a layer of carbon nanotubes 1408 oriented substantially perpendicular to the surface 1406 of the heat spreader facing the solid-state device. A Raman spectrum of the layer of carbon nanotubes has a D peak at ~1350 cm$^{-1}$ with an intensity $I_D$, a G peak at ~1585 cm$^{-1}$ with an intensity $I_G$, and an intensity ratio $I_D/I_G$ of less than 0.7 at a laser excitation wavelength of 514 nm. In some embodiments, the intensity ratio $I_D/I_G$ is less than 0.6.

Figure 19:
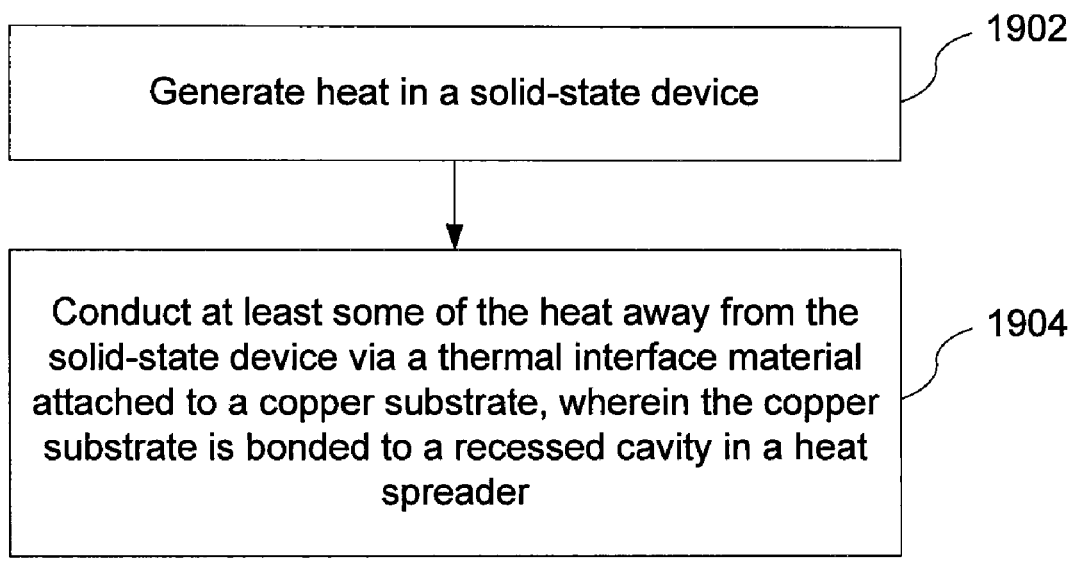
FIG. 19 is a flow diagram illustrating a process for removing heat from a solid state-device (e.g., an integrated circuit) in accordance with some embodiments.

FIG. 19 is a flow diagram illustrating a process for removing heat from a solid-state device (e.g., integrated circuit 1616) in accordance with some embodiments.

Heat is generated (1902) in a solid-state device (e.g., during the use of a computer containing integrated circuit 1616).

At least some of the heat is conducted (1904) away from the solid-state device via a thermal interface material 1606 attached to a copper substrate 1604. The copper substrate 1604 is bonded to a recessed cavity 1614 in a heat spreader 1602.

Figure 20:
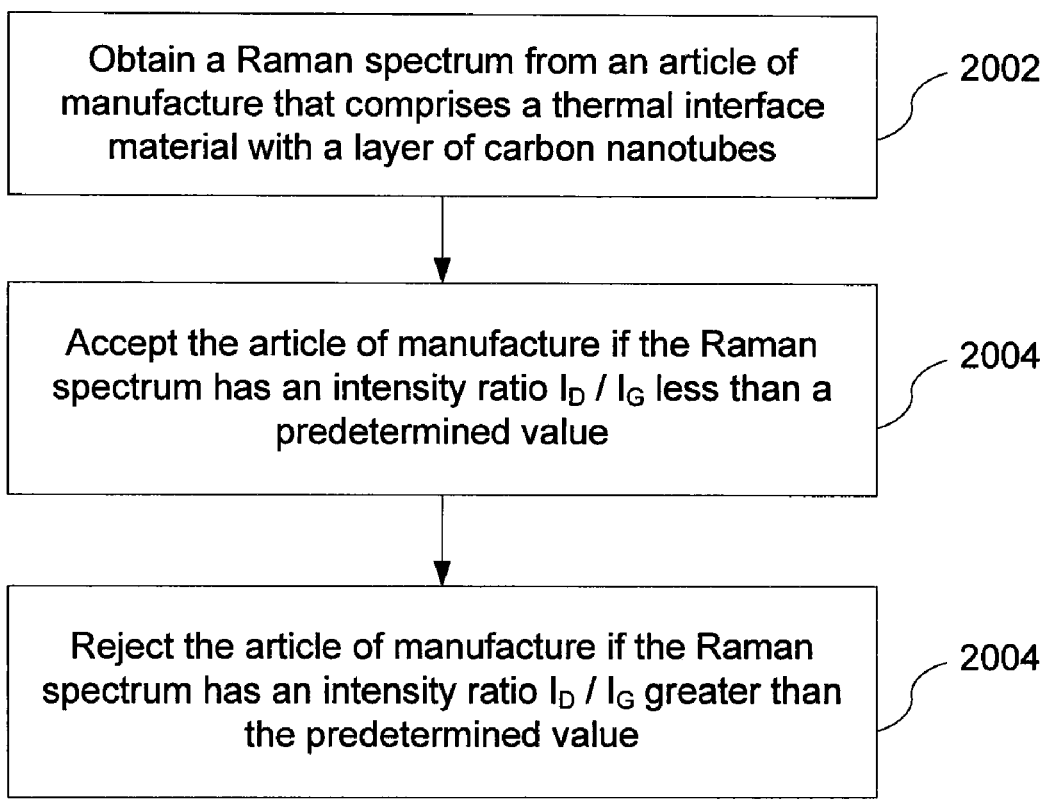
FIG. 20 is a flow diagram illustrating a process for using Raman spectroscopy to monitor thermal interface material quality in accordance with some embodiments.

FIG. 20 is a flow diagram illustrating a process for using Raman spectroscopy to monitor thermal interface material quality in accordance with some embodiments.

A Raman spectrum is obtained (2002) from an article of manufacture that comprises a thermal interface material with a layer of carbon nanotubes. The Raman spectrum of the layer of carbon nanotubes has a D peak at ~1350 cm$^{-1}$ with an intensity $I_D$ and a G peak at ~1585 cm$^{-1}$ with an intensity $I_G$. In some embodiments, the article of manufacture comprises a copper substrate (e.g., 202) with a shape that is configured to fit in a recessed cavity in a heat spreader. In some embodiments, the article of manufacture comprises a heat spreader (e.g., 802).

The article of manufacture is accepted (2004) if the Raman spectrum has an intensity ratio $I_D/I_G$ less than a predetermined value. In some embodiments, the predetermined value is 0.7. In some embodiments, the predetermined value is 0.6.

The article of manufacture is rejected (2006) if the Raman spectrum has an intensity ratio $I_D/I_G$ greater than the predetermined value.

Thus, articles of manufacture with thermal interface materials based on carbon nanotubes can be easily screened with Raman spectroscopy.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An article of manufacture, comprising:
a copper substrate with a surface;
a catalyst on top of the copper substrate surface; and
a thermal interface material that comprises a layer containing carbon nanotubes that contacts the catalyst, wherein the carbon nanotubes are oriented substantially perpendicular to the surface of the copper substrate;
a Raman spectrum of the layer containing carbon nanotubes has a D peak at ~1350 cm$^{-1}$ with an intensity $I_D$, a G peak at ~1385 cm$^{-1}$ with an intensity $I_G$, and an intensity ratio $I_D/I_G$ of less than 0.7 at a laser excitation wavelength of 514 nm;
the thermal interface material comprising the layer containing carbon nanotubes has:
a bulk thermal resistance,
a contact resistance at an interface between the thermal interface material and the copper substrate, and
a contact resistance at an interface between the thermal interface material and a solid-state device; and
a summation of the bulk thermal resistance, the contact resistance at the interface between the thermal interface material and the copper substrate, and the contact resistance at the interface between the thermal interface material and the solid-state device has a value of 0.06 cm²K/W or less.

2. The article of manufacture of claim 1, wherein the summation of the bulk thermal resistance, the contact resistance at the interface between the thermal interface material and the copper substrate, and the contact resistance at the interface between the thermal interface material and the solid-state has a value of 0.03 cm² K/W or less.

3. The article of manufacture of claim 1, wherein the summation of the bulk thermal resistance, the contact resistance at the interface between the thermal interface material and the copper substrate, and the contact resistance at the interface between the thermal interface material and the solid-state has a value of 0.02 cm²K/W or less.

4. The article of manufacture of claim 1, wherein the summation of the bulk thermal resistance, the contact resistance at the interface between the thermal interface material and the copper substrate, and the contact resistance at the interface between the thermal interface material and the solid-state has a value of between 0.02-0.06 cm² K/W.

5. The article of manufacture of claim 1, wherein the substrate includes copper that contains less than 40 parts per million (ppm) oxygen.

6. The article of manufacture of claim 1, wherein the layer of carbon nanotubes has a coverage density of between about 15 to 40%.

7. An article of manufacture, comprising:
a heat spreader with a surface configured to face a solid-state device; and
a thermal interface material attached to the heat spreader comprising a layer of carbon nanotubes, wherein:
the carbon nanotubes are oriented substantially perpendicular to the surface of the heat spreader configured to face a solid-state device;
a Raman spectrum of the layer of carbon nanotubes has a D peak at ~1350 cm$^{-1}$ with an intensity $I_D$, a G peak at ~1385 cm$^{-1}$ with an intensity $I_G$, and an intensity ratio $I_D/I_G$ of less than 0.7 at a laser excitation wavelength of 514 nm;
the thermal interface material comprising the layer containing carbon nanotubes has:
a bulk thermal resistance,
a contact resistance at an interface between the thermal interface material and the heat spreader configured to face the solid-state device, and
a contact resistance at an interface between the thermal interface material and a solid-state device; and
a summation of the bulk thermal resistance, the contact resistance at the interface between the thermal interface material and the surface of the heat spreader, and the contact resistance at the interface between the thermal interface material and the solid-state device has a value of 0.06 cm²K/W or less.

8. The article of manufacture of claim 7, wherein the summation of the bulk thermal resistance, the contact resistance at the interface between the thermal interface material and the surface of the heat spreader configured to face the solid-state device, and the contact resistance at the interface between the thermal interface material and the solid-state has a value of 0.03 cm²K/W or less.

9. The article of manufacture of claim 7, wherein the summation of the bulk thermal resistance, the contact resistance at the interface between the thermal interface material and the surface of the heat spreader configured to face the solid-state device, and the contact resistance at the interface between the thermal interface material and the solid-state has a value of 0.02 cm²K/W or less.

10. The article of manufacture of claim 7, wherein the summation of the bulk thermal resistance, the contact resistance at the interface between the thermal interface material and the surface of the heat spreader configured to face the solid-state device, and the contact resistance at the interface between the thermal interface material and the solid-state has a value of between 0.02-0.06 cm²K/W.

11. The article of manufacture of claim 7, wherein the thermal interface material is attached to the heat spreader by growing the layer of carbon nanotubes on the heat spreader.

12. The article of manufacture of claim 7, wherein the thermal interface material is attached to the heat spreader by growing the layer of carbon nanotubes on a copper substrate and attaching the copper substrate to the heat spreader.

13. The article of manufacture of claim 12, wherein the copper substrate is attached to the heat spreader by bonding the substrate to a recessed cavity in the heat spreader.

14. The article of manufacture of claim 7, wherein the thermal interface material comprises a phase change material located between the carbon nanotubes.

15. The article of manufacture of claim 14, wherein the phase change material comprises a wax.

16. The article of manufacture of claim 14, wherein the phase change material comprises a paraffin.

17. The article of manufacture of claim 7, wherein the solid-state device is an integrated circuit.

18. The article of manufacture of claim 7, wherein a solid-state device may be removably connected to the thermal interface material.

19. The article of manufacture of claim 7, wherein the thermal interface material is configured to enable a solid-state device to be connected to the thermal interface material, disconnected from the thermal interface material, and then reconnected to the thermal interface material.

20. The article of manufacture of claim 19, wherein the solid-state device is an integrated circuit.

21. The article of manufacture of claim 7, wherein the article of manufacture is configured to be reused to cool a succession of solid-state devices.

22. An article of manufacture, comprising:
a solid-state device;
a heat spreader with a surface facing the solid-state device; and
a thermal interface material attached to the heat spreader and contacting the solid-state device comprising a layer of carbon nanotubes, wherein:
the carbon nanotubes are oriented substantially perpendicular to the surface of the heat spreader configured to face a solid-state device;
a Raman spectrum of the layer of carbon nanotubes has a D peak at ~1350 cm$^{-1}$ with an intensity $I_D$, a G peak at ~1385 cm$^{-1}$ with an intensity $I_G$, and an intensity ratio $I_D/I_G$ of less than 0.7 at a laser excitation wavelength of 514 nm;
the thermal interface material comprising the layer containing carbon nanotubes has:
a bulk thermal resistance,
a contact resistance at an interface between the thermal interface material and the heat spreader configured to face the solid-state device, an a contact resistance at an interface between the thermal interface material and a solid-state device; and a summation of the bulk thermal resistance, the contact resistance at the interface between the thermal interface material and the heat spreader, and the contact resistance at the interface between the thermal interface material and the solid-state device has a value of 0.06 cm$^2$K/W or less.

* * * * *